United States Patent
Segawa et al.

(10) Patent No.: US 9,412,634 B2
(45) Date of Patent: Aug. 9, 2016

(54) ATMOSPHERE REPLACEMENT APPARATUS, SUBSTRATE TRANSPORT APPARATUS, SUBSTRATE TRANSPORT SYSTEM, AND EFEM

(71) Applicant: SINFONIA TECHNOLOGY CO., LTD., Tokyo (JP)

(72) Inventors: Mikio Segawa, Tokyo (JP); Yasushi Taniyama, Tokyo (JP); Shin Kawahisa, Tokyo (JP); Mitsuo Natsume, Tokyo (JP)

(73) Assignee: SINFONIA TECHNOLOGY CO., LTD., Tokyo (JP)

( * ) Notice: Subject to any disclaimer, the term of this patent is extended or adjusted under 35 U.S.C. 154(b) by 88 days.

(21) Appl. No.: 14/537,477

(22) Filed: Nov. 10, 2014

(65) Prior Publication Data

US 2015/0128441 A1 May 14, 2015

(30) Foreign Application Priority Data

Nov. 11, 2013 (JP) ................................. 2013-233572
Nov. 11, 2013 (JP) ................................. 2013-233573

(51) Int. Cl.
*H01L 21/677* (2006.01)
*H01L 21/673* (2006.01)

(52) U.S. Cl.
CPC .... *H01L 21/67772* (2013.01); *H01L 21/67389* (2013.01); *H01L 21/67742* (2013.01)

(58) Field of Classification Search
CPC ................... H01L 21/67742; H01L 21/67772; H01L 21/67389; F26B 25/003
USPC .......................................... 414/217, 939, 805
See application file for complete search history.

(56) References Cited

U.S. PATENT DOCUMENTS

| 8,757,026 B2* | 6/2014 | Barker .............. H01L 21/67742 74/490.01 |
| 2013/0162117 A1* | 6/2013 | Hara ................... H01L 21/6773 312/31 |
| 2015/0128441 A1* | 5/2015 | Segawa ............. H01L 21/67389 34/236 |

FOREIGN PATENT DOCUMENTS

| JP | 11-251402 A | 9/1999 |
| JP | 2012-49382 A | 3/2012 |

\* cited by examiner

*Primary Examiner* — Kaitlin Joerger
(74) *Attorney, Agent, or Firm* — Westerman, Hattori, Daniels & Adrian, LLP

(57) ABSTRACT

The present invention provides an atmosphere replacement apparatus capable of replacing the atmosphere on the surface of a wafer with a small amount of gas. The apparatus is configured to have a cover capable of facing and covering the wafer to be transported, and a gas supply means that supplies gas having properties different from a surrounding atmosphere from the cover, and replaces the atmosphere on the surface of the wafer by the gas.

19 Claims, 34 Drawing Sheets

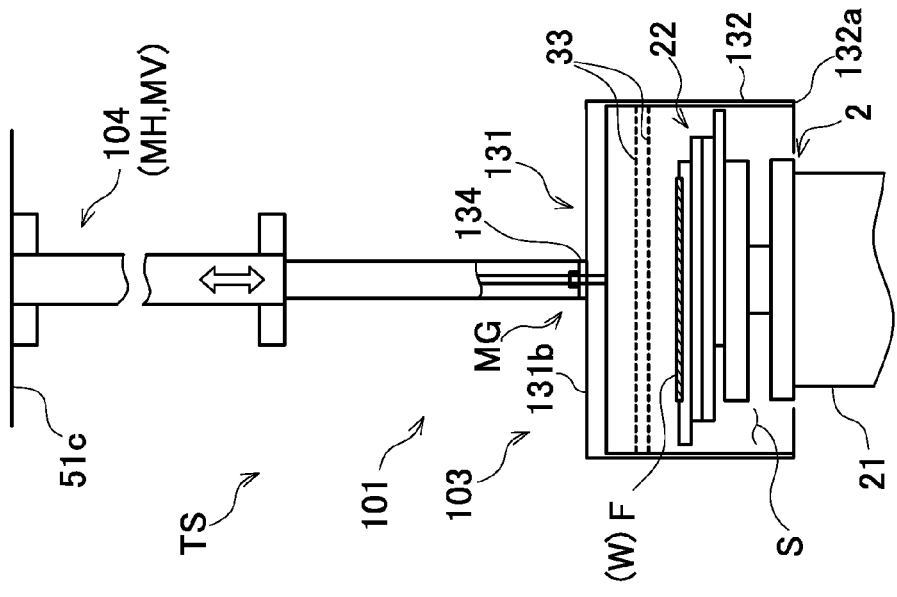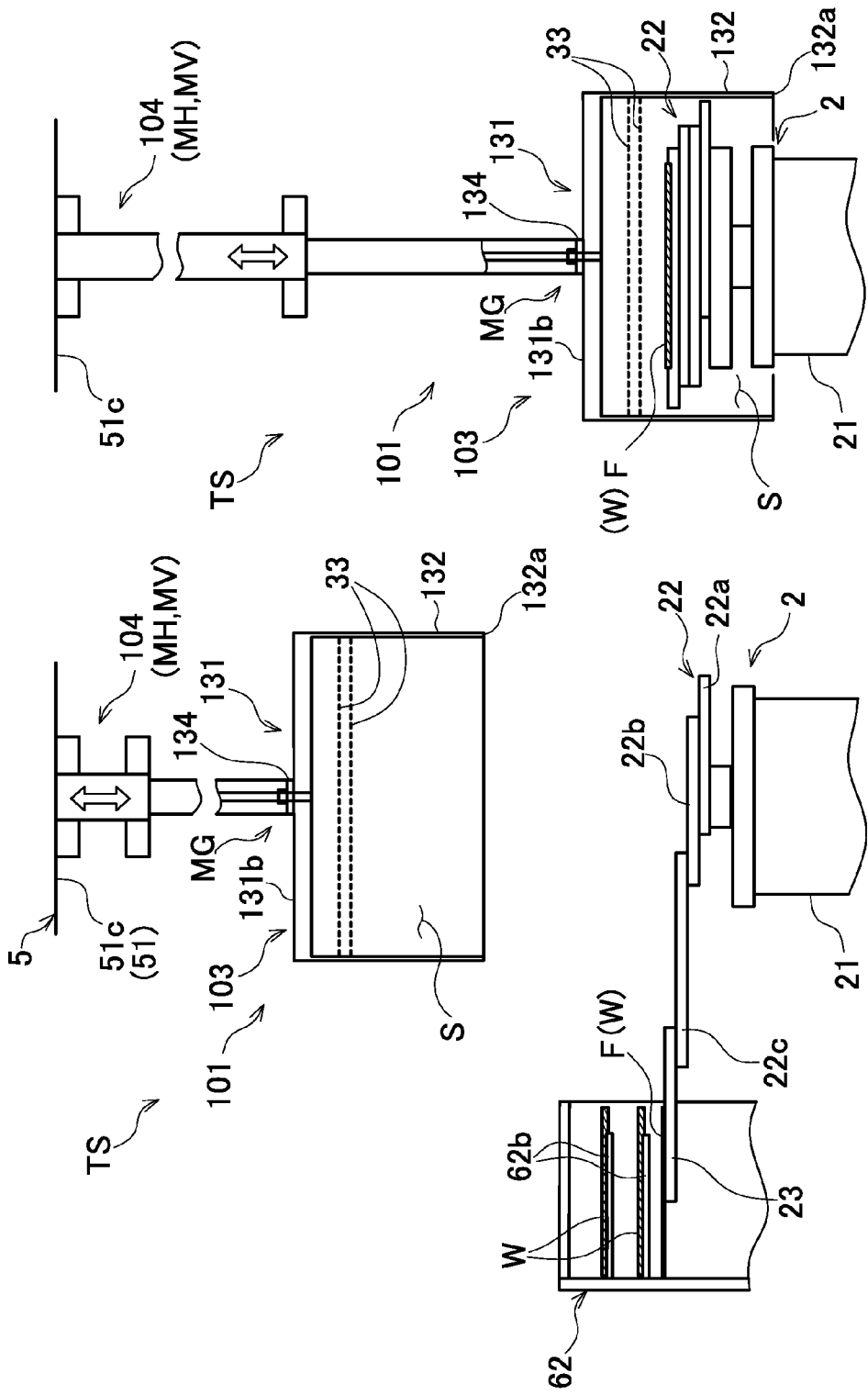

Fig. 19A
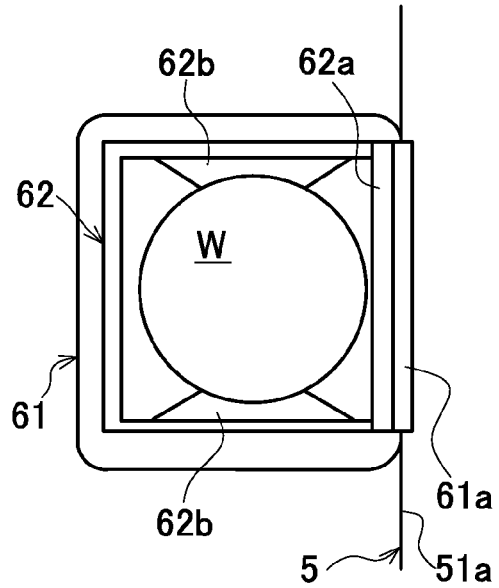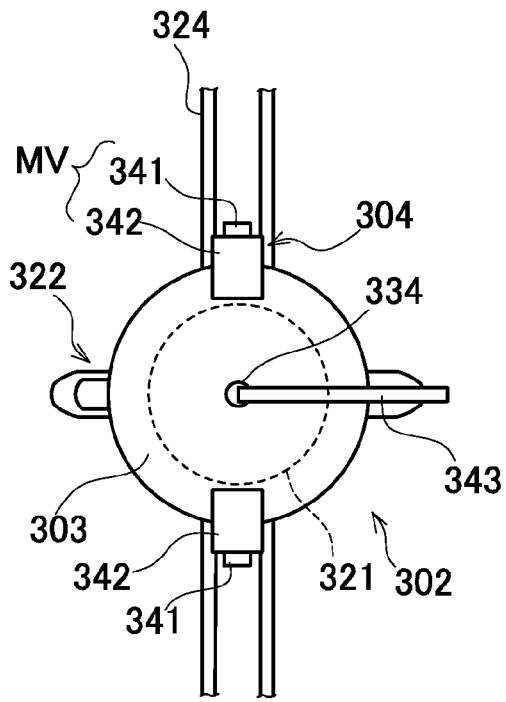
Fig. 19B
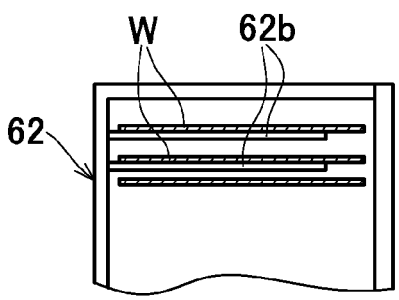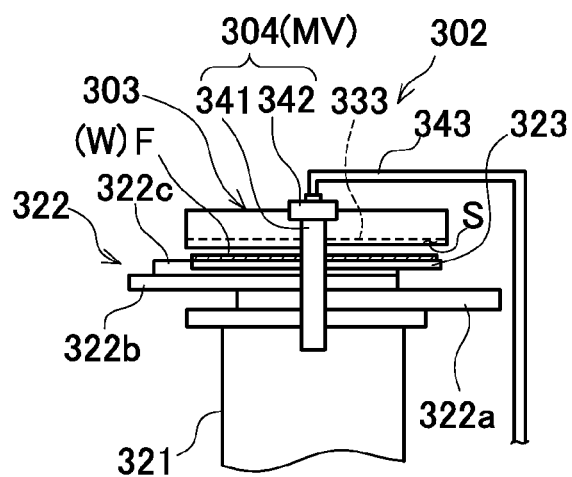

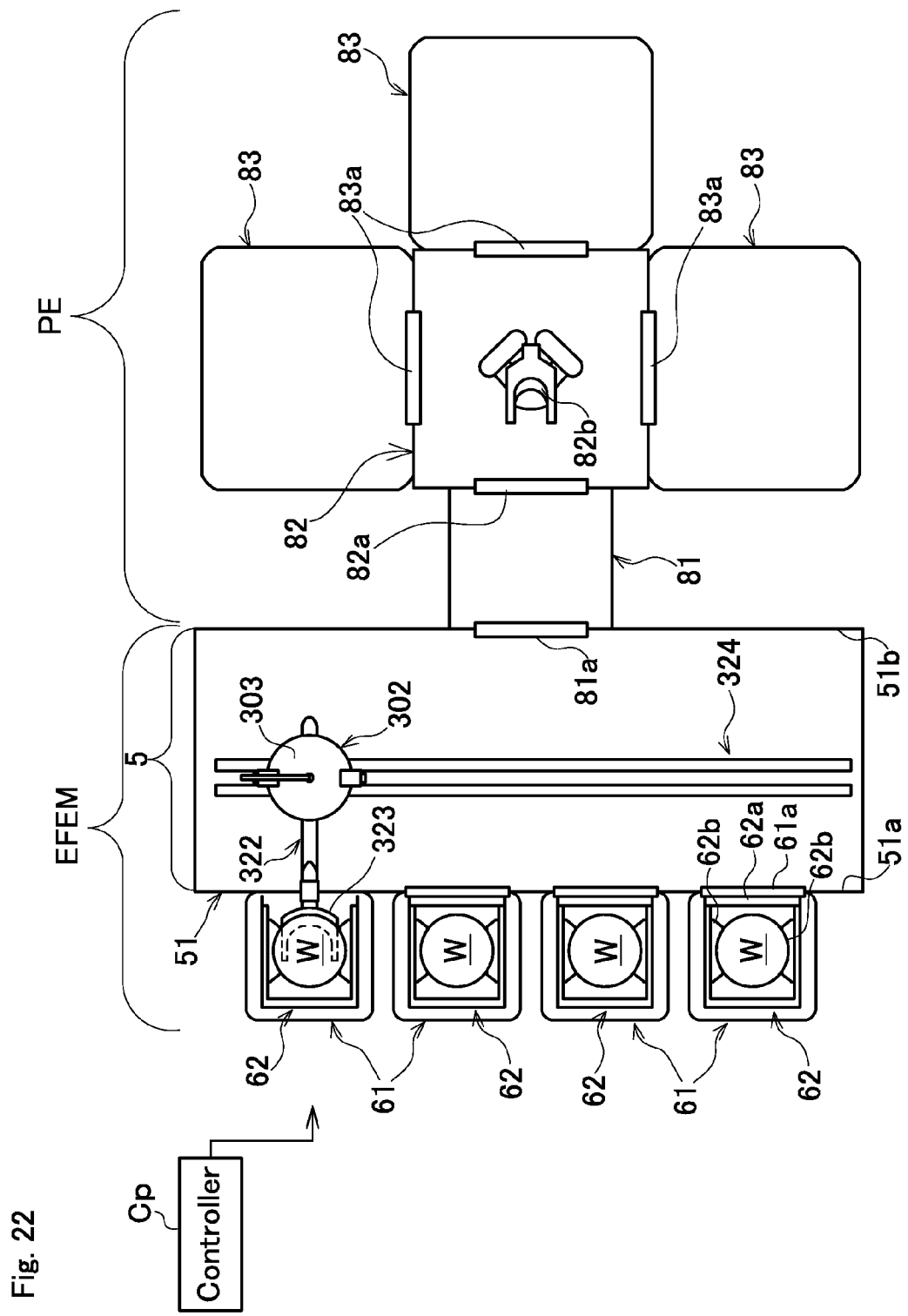

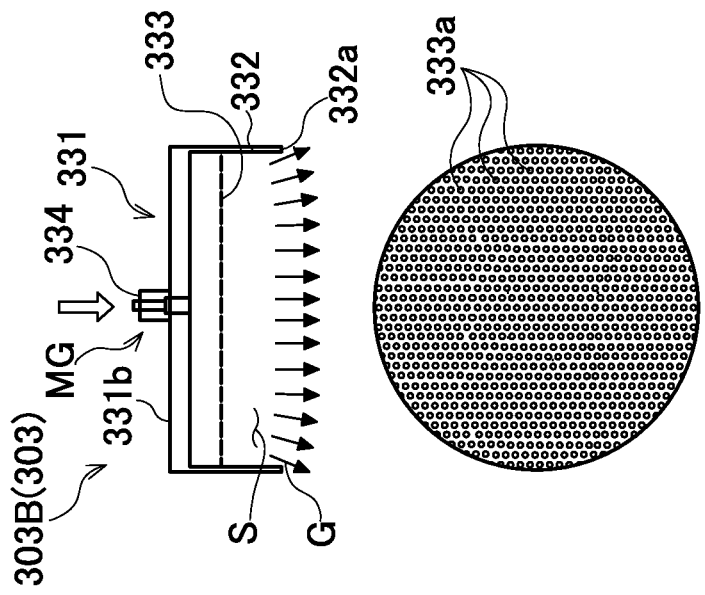
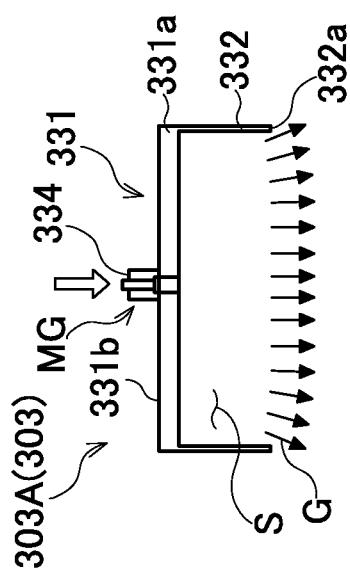

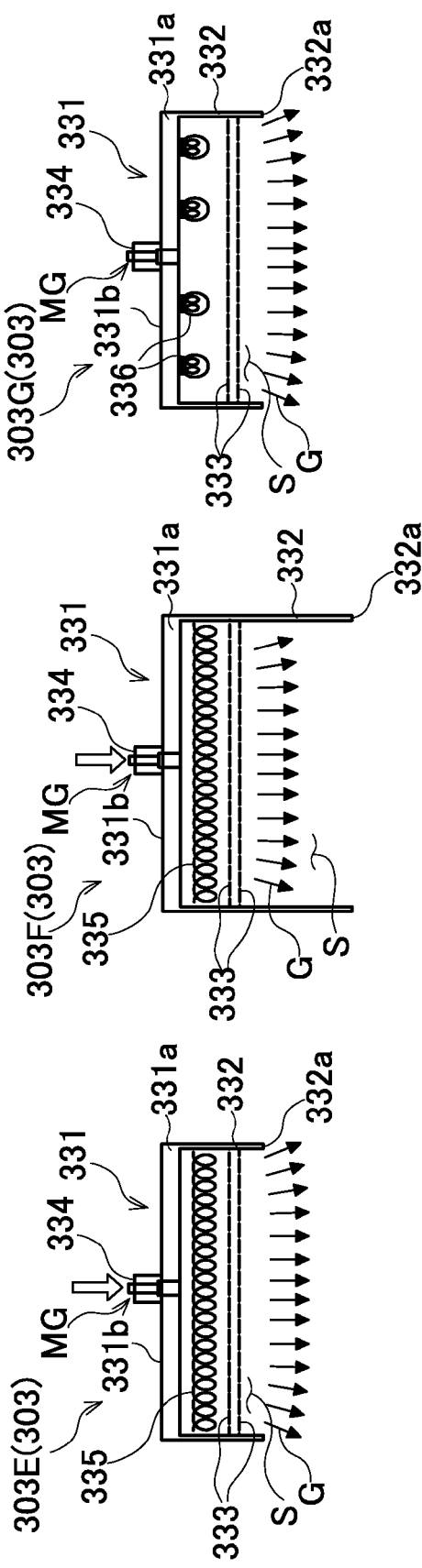

ATMOSPHERE REPLACEMENT APPARATUS, SUBSTRATE TRANSPORT APPARATUS, SUBSTRATE TRANSPORT SYSTEM, AND EFEM

CROSS-REFERENCE TO RELATED APPLICATIONS

This application claims priorities of Japanese Patent Application No. 2013-233572 filed on Nov. 11, 2013 and Japanese Patent Application No. 2013-233573 filed on Nov. 11, 2013. The contents of the application are incorporated herein by reference in their entirety.

BACKGROUND OF THE INVENTION

1. Field of the Invention

The present invention relates to an atmosphere replacement apparatus capable of replacing an atmosphere around a substrate during transportation, a substrate transport apparatus, a substrate transport system, and an Equipment Front End Module (EFEM).

2. Description of the Related Art

Conventionally, production of semiconductors has been carried out by various processing steps performed on a wafer as a substrate. In recent years, circuit miniaturization and high integration of elements have been increasingly promoted. It has been required to maintain a high level of cleanliness around a wafer to prevent adhesion of water and particles to a surface of a wafer. Further, to prevent changes in properties of a surface of a wafer, such as oxidization, it has been performed to make a periphery of a wafer vacuum or nitrogen atmosphere that is an inert gas.

In order to properly maintain such an atmosphere around a wafer, a wafer is managed by placing in a sealable storage pod called a Front-Opening Unified Pod (FOUP), and nitrogen is filled inside the pod. Further, to transfer a wafer between a FOUP and a processing apparatus for processing a wafer, an Equipment Front End Module (EFEM) as disclosed in Patent Application Publication No. 2012-49382 is provided. An EFEM constitutes a wafer transport chamber that is substantially closed inside a housing, comprises a load port that functions as an interface unit between the FOUP on one of opposite wall surfaces, and is connected to a load lock chamber that is a part of a processing apparatus on the other of the wall surfaces. In a wafer transport chamber, a wafer transport apparatus is provided, constituting a wafer transport system for transporting a wafer. By using a wafer transport apparatus, a wafer is loaded and unloaded between a load lock chamber and a FOUP connected to a load port.

In other words, a wafer is taken out from the FOUP (a load port) that is one transfer position by using the wafer transport apparatus, and transported to the load lock chamber that is the other transfer position. The processing apparatus performs processing for a wafer transported through the load lock chamber within a processing unit called a process chamber. After the processing is completed, the wafer is taken out through the load lock chamber, and returned to the FOUP.

The interior of the processing apparatus is made to a special atmosphere, a vacuum or the like in accordance with the processing, to enable quickly the processing for a wafer. The interior of the wafer transport chamber in the EFEM is kept in a clean air atmosphere at a high level of cleanliness by introducing the air cleaned through a chemical filter or the like, to prevent contamination due to adhesion of particles or the like to the surface of a wafer during transport.

However, in recent years, as the cleanliness has been advanced more and more, although the cleanliness is high in the wafer transport chamber of EFEM, the influence of the air atmosphere different from the interior of the FOUP or the processing apparatus has been concerned.

In other words, the air atmosphere has a possibility of adhesion of moisture and oxygen to the surface of a substrate, causing corrosion and oxidation. Further, when a corrosive gas or the like used in the processing apparatus remains on the surface of a wafer, it may cause corrosion of a wiring material on the wafer surface and deterioration in yield. To avoid such a problem, as in the FOUP, when the atmosphere replacement apparatus is provided to make a nitrogen atmosphere inside the wafer transport chamber, since the volume of the wafer transport chamber is large, a large amount of nitrogen gas is required, increasing the cost, and it takes a long time to replace nitrogen. Further, if nitrogen leaks from the EFEM, it may cause a problem of oxygen deficiency in the surrounding. Further, in recent years, an EFEM capable of connecting multiple FOUPs has been proposed in order to increase the efficiency. This increases the volume of the wafer transport chamber, and the above problem may become conspicuous.

In addition, the above problem arises similarly during transportation of a substrate other than a wafer, as long as the transportation is done in an atmosphere different from a processing or storage location.

The present invention has been made to solve efficiently the above problems. In particular, it is an object of the invention to provide an atmosphere replacement apparatus capable of replacing atmosphere on a surface of a substrate during transportation by a small amount of gas, a substrate transport apparatus, a substrate transport system, and an Equipment Front End Module (EFEM).

SUMMARY OF THE INVENTION

In order to achieve the above object, the present invention has taken the measures as described below.

An atmosphere replacement apparatus according to an embodiment of the present invention comprises a cover that is able to face and cover a substrate to be transported, and a gas supply means that supplies gas having properties different from a surrounding atmosphere from the cover, and replaces an atmosphere on a surface of a substrate by the gas.

In such a configuration, by supplying a gas having properties different from a surrounding atmosphere to the surface of a substrate with the cover faced to the substrate, it is possible to appropriately replace an atmosphere around the surface of the substrate, and prevent adverse effects on the substrate. In addition, as compared with the case of replacing all atmospheres around the substrate transport apparatus, it is possible to reduce the supply amount of gas, the cost of gas, and the time required to replace the atmosphere. Further, even when the gas leaks to the surroundings, as the supply amount of gas is small, it is possible to suppress deterioration in the working environment.

Further, in order to make the cover movable independently of a substrate, cause to perform a preparatory operation for a substrate to be next transported, and retract to be unused when the gas supply is unnecessary, it is preferable to configure the atmosphere replacement apparatus to be used in a substrate transport system that transports a substrate between multiple transfer positions by a substrate transport apparatus, and to comprise a cover moving means that supports the cover movable independently of the substrate transport apparatus, wherein when the substrate transport apparatus transports a substrate, the cover moving means moves the cover to a position opposite to a substrate.

In order to replace an atmosphere around the surface of a substrate with a small amount of gas, and avoid interference between the cover and the substrate and the substrate transfer apparatus, it is preferable to comprise a cover approach and separation means that approaches or separates the cover from the surface of a substrate.

In order to further reduce the supply amount of gas by decreasing the amount of gas leaking to other than the substrate surface, it is preferable that the cover comprises a main body part able to face a substrate and a wall part provided on a periphery of the main body part, and a substrate is housed in an internal space formed between the main body part and the wall part, when the cover approach and separation means moves the cover close to a substrate.

In order to be able to reduce the supply amount of gas, it is preferable to provide a cover receiving member in the substrate transport apparatus, which substantially closes the internal space in cooperation with the cover, when the cover is approaches a substrate, and an open end of the cover wall part approaches or contacts the cover receiving member.

In order to replace efficiently an atmosphere on the surface of a substrate by supplying gas to the entire surface of a substrate only by introducing gas as easily as general piping, it is preferable that the gas supply means comprises a gas inlet for introducing gas from outside, and a gas diffusion means for diffusing gas downward the cover from the gas inlet.

In order to eliminate moisture effectively by increasing a temperature of the surface of a substrate, it is preferable that the gas supply means comprises a heating means for heating the gas.

In order to configure easily and inexpensively a substrate transport system comprising the atmosphere replacement apparatus and the substrate transport apparatus, it is preferable to configure the cover moving means by using a guide rail that constitutes a part of the substrate transport apparatus.

It is possible to configure as an effective EFEM capable of transferring between a FOUP and a processing apparatus, while maintaining good properties on the surface of a wafer, by configuring as an EFEM that comprises the substrate transport system, and a housing for covering the substrate transport system, wherein the substrate is a wafer, and the transfer position is set adjacent to a wall surface of the housing.

It is possible to configure as an effective EFEM capable of transferring between a FOUP and a processing apparatus, while maintaining good properties of the surface of a wafer, by configuring as an EFEM comprising a substrate transport system that includes the atmosphere replacement apparatus and the substrate transport apparatus, and a housing for covering the substrate transport system, wherein the substrate is a wafer, and the cover moving means is supported on a ceiling provided within the housing, and the transfer position is set adjacent to a wall surface of the housing.

Further, the substrate transport apparatus according to an embodiment of the invention comprises the atmosphere replacement apparatus described above, and further comprises a transport arm that is supported by a base, and holds and transports a substrate, and a support bar that is provided on the same base as the transport arm, wherein the cover is located at a position able to face the transport arm via the support bar.

In such a configuration, when the transport arm transports a substrate, the gas supply means supplies a gas having properties different from a surrounding atmosphere to the surface of a substrate from the cover arranged above the transport arm, and the atmosphere around the surface of a substrate can be replaced with the gas. Thus, the surrounding atmosphere having an influence upon the substrate surface can be appropriately changed. In addition, as compared with the case of replacing all atmospheres around the substrate transport apparatus, it is also possible to reduce the supply amount of gas, the cost of gas, and the time required to replace the atmosphere. Further, even when the gas leaks to the surroundings, as the amount of gas is small, it is possible to suppress deterioration in the working environment. Further, since the cover having the gas supply means is provided on the same base as the transport arm, it is possible to reduce the installation area by making the entire structure compact.

In order to avoid interference of the cover to the transport arm and substrate, and to enable to replace the atmosphere around the surface of a substrate with smaller amount of gas by moving the cover close to a substrate depending upon a transport state, and, it is preferable to be configured to include a cover approach and separation means that approaches or separates the cover from the surface of a substrate.

In order to reduce the supply amount of gas by decreasing the amount of gas leaking to the parts other than the surface of a substrate, it is preferable that the cover comprises a main body part able to face a substrate and a wall part provided on the periphery of the main body part, and a substrate is housed in an internal space formed between the main body part and the wall part, when the cover approach and separation means approaches or separates the cover from a substrate.

In order to further reduce the supply amount of gas, it is preferable to be configured to comprise a cover receiving member that substantially closes the internal space in cooperation with the cover, when the cover approaches a substrate, and an open end of the cover wall part approaches or contacts the cover receiving member.

In order to expand a range capable of transporting a substrate without increasing the length of the transport arm, it is preferable to be configured to comprise a guide rail that supports the base movable.

In order to further reduce the supply amount of gas by reducing the size of the cover, it is preferable be configured to comprise a cover moving means that supports the cover movable in a direction orthogonal to the guide rail.

In order to effectively supply gas to the surface of a substrate during transportation with a simple structure, it is preferable to be configured to set a transfer position for transferring a substrate to the transfer arm on both sides of the guide rail, across the guide rail, and to extend the cover in a direction orthogonal to the guide rail.

In order to effectively replace the atmosphere on the substrate surface by diffusing and supplying gas to the entire surface of a substrate, while a gas inlet is configured as simple as general piping, it is preferable that the gas supply means comprises a gas inlet for introducing gas from outside, and a gas diffusion means for diffusing gas below the cover from the gas inlet.

In order to eliminate moisture effectively by increasing a temperature of the surface of a substrate by the supplied gas, it is preferable that the gas supply means comprises a heating means for heating the gas.

It is possible to configure as an effective EFEM capable of transferring between a FOUP and a processing apparatus, while maintaining good properties on the surface of a wafer, by configuring as an EFEM that comprises the substrate transport apparatus, and a housing for covering the substrate transport apparatus, wherein the substrate is a wafer, and a transfer position for transferring a substrate is set adjacent to a wall surface of the housing.

According to the invention described above, it is possible to provide an atmosphere replacement apparatus capable of replacing an atmosphere around a substrate during transportation by a small amount of gas without increasing the cost and time required for the replacement, a substrate transport apparatus, a substrate transport system, and an Equipment Front End Module (EFEM).

BRIEF DESCRIPTION OF THE DRAWINGS

FIGS. 16(a) and (b) are explanatory drawings showing an atmosphere replacement apparatus according to a second embodiment of the invention, and the structure of a substrate transport system that comprises the apparatus.

FIGS. 19(a) and (b) are explanatory drawings schematically showing enlarged essential parts of the wafer transport apparatus.

FIG. 22 is a plan view schematically showing the state that the transport arm of the wafer transport apparatus enters a FOUP.

FIGS. 24(a) and (b) are explanatory drawings showing the structure of a cover constituting the wafer transport apparatus.

FIG. 26(a)-(c) are explanatory drawings showing the structure of a cover different from those shown in FIG. 24 and FIG. 25.

DESCRIPTION OF THE PREFERRED EMBODIMENTS

Hereinafter, preferred embodiments of the present invention will be specifically described with reference to the accompanying drawings.

First Embodiment

Figure 1:
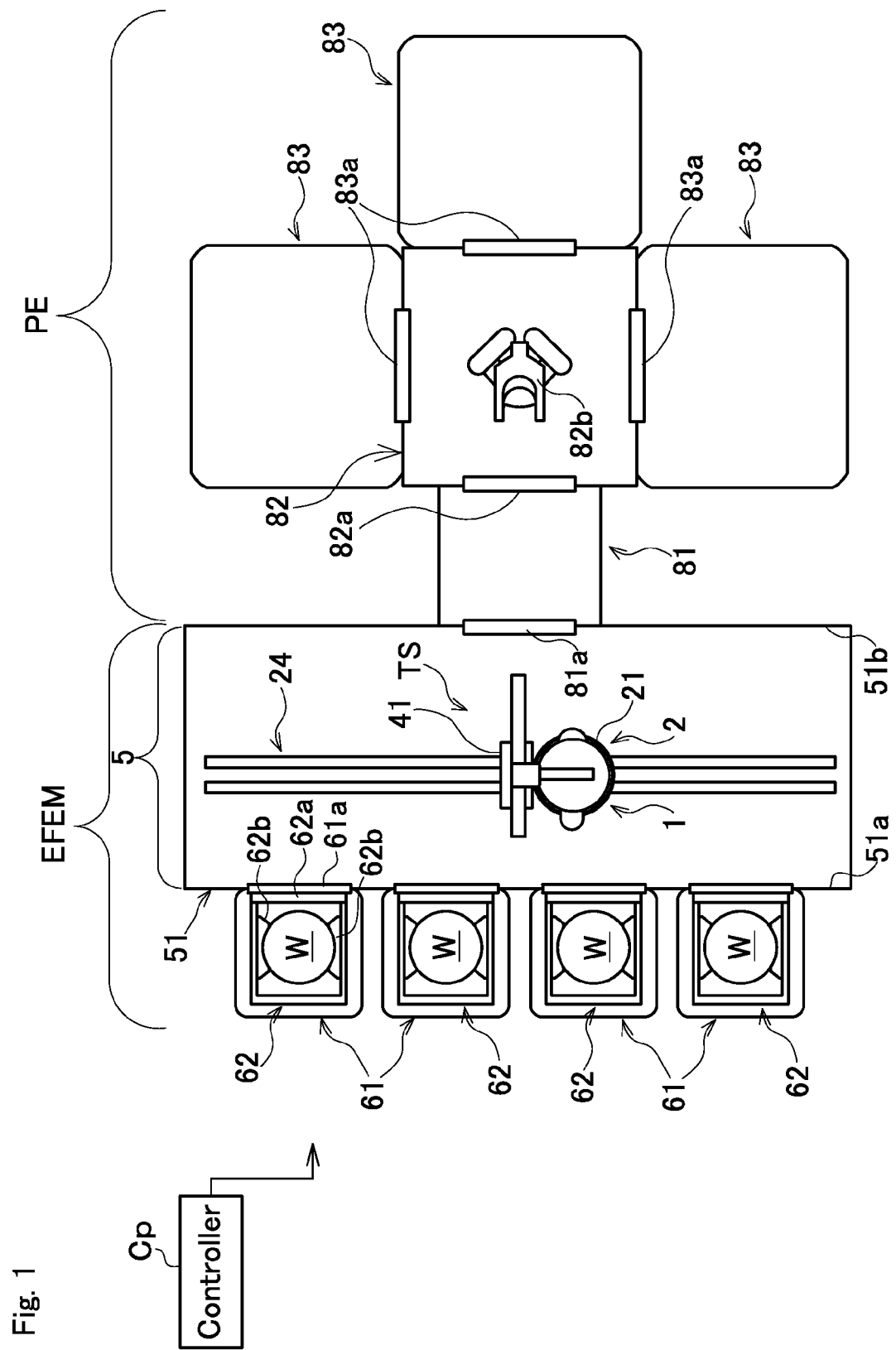
FIG. 1 is a plan view schematically showing a positional relationship between an EFEM that comprises a substrate transport system including an atmosphere replacement apparatus according to a first embodiment, and a processing apparatus.

As shown in FIG. 1, an atmosphere replacement apparatus 1 of a first embodiment configures a wafer transport apparatus 2 or a substrate transport apparatus, and a wafer transport system TS or a substrate transport system. A wafer transport chamber 5 is substantially closed by a housing 51 surrounding the apparatus or system. A plurality of load ports 61 (four in the drawing) is provided adjacent to one wall surface 51a of the housing. The load ports and the wafer transport system TS configure an EFEM. The drawing schematically shows the state that a FOUP 62 is placed on the load port 61. Each load port 61 has a door 61a. As the door 61a moves in conjunction with a lid 62a of the FOUP 62, the FOUP 62 is opened to the wafer transport chamber 5. In the FOUP 62, a plurality of placing portions 62b for supporting one wafer W in pairs is provided in the vertical direction. By using them, a plurality of wafers W can be stored. A nitrogen gas can be filled in the FOUP 62, and an atmosphere in the FOUP 62 can be replaced with nitrogen via the load port 61.

The wafer transport chamber 5 constituting an EFEM can be connected to the load lock chamber 81 that constitutes a part of a processing unit PE adjacent to a wall surface 51b opposite to the load port 61. By opening a door 81a of the load lock chamber 81, the load lock chamber 81 can communicate with the wafer transport chamber 5. A variety of configurations can be used as a processing unit PE. Generally, a transport chamber 82 is provided adjacent to the load lock chamber 81, and a plurality of processing units 83 (three in the drawing) is provided adjacent to the transport chamber 82. A door 82a is provided between the load lock chamber 81 and the transport chamber 82, and a door 83a is provided between a processing unit 83 and the transport chamber 82. By opening the doors, the chambers and the unit can communicate each other, and a transport robot 82b provided within the transport chamber 82 can transfer a wafer W between the load lock chamber 81 and the processing unit 83.

Figure 2A:
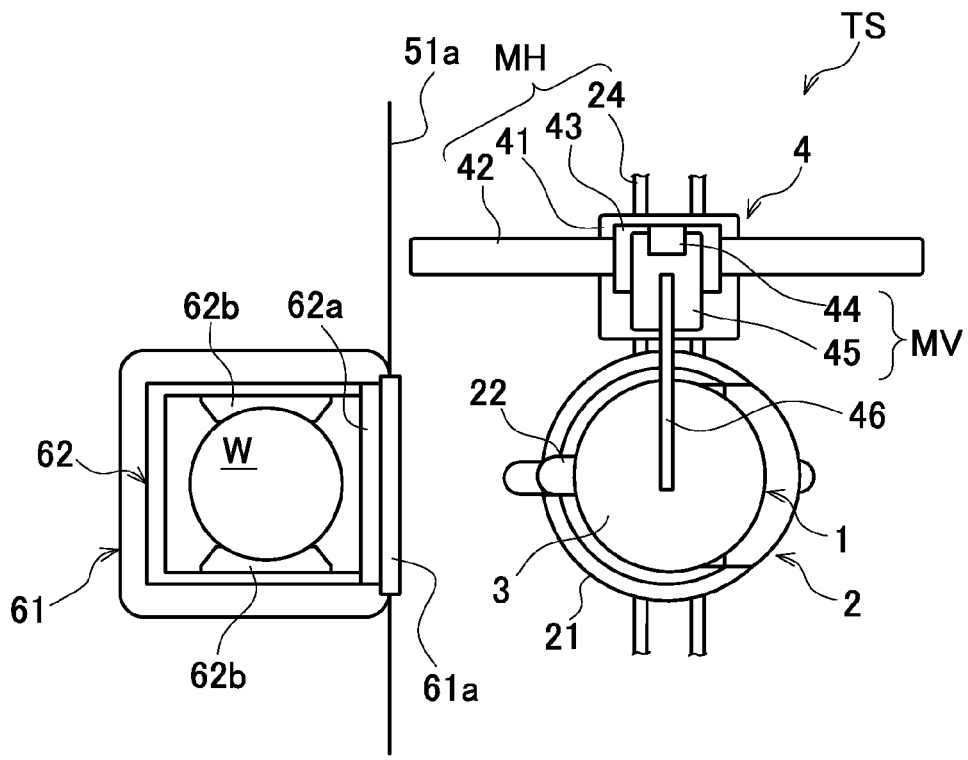
FIGS. 2(a) and (b) are explanatory drawings schematically showing the essential parts of a substrate transport system including the atmosphere replacement apparatus.
Figure 2B:
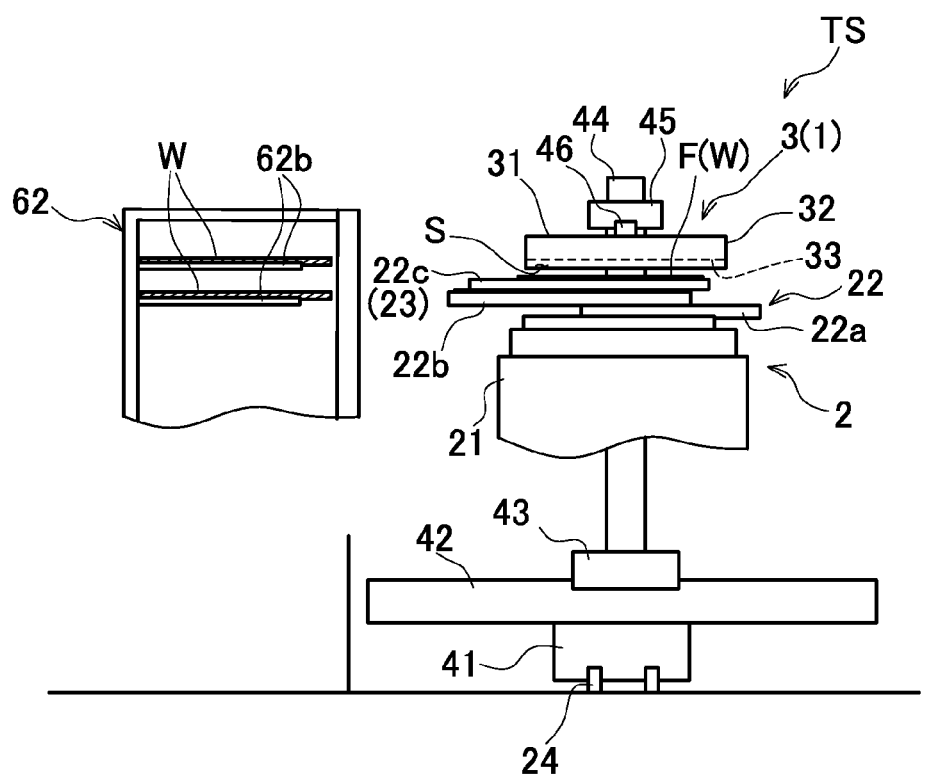
Figure 3A:
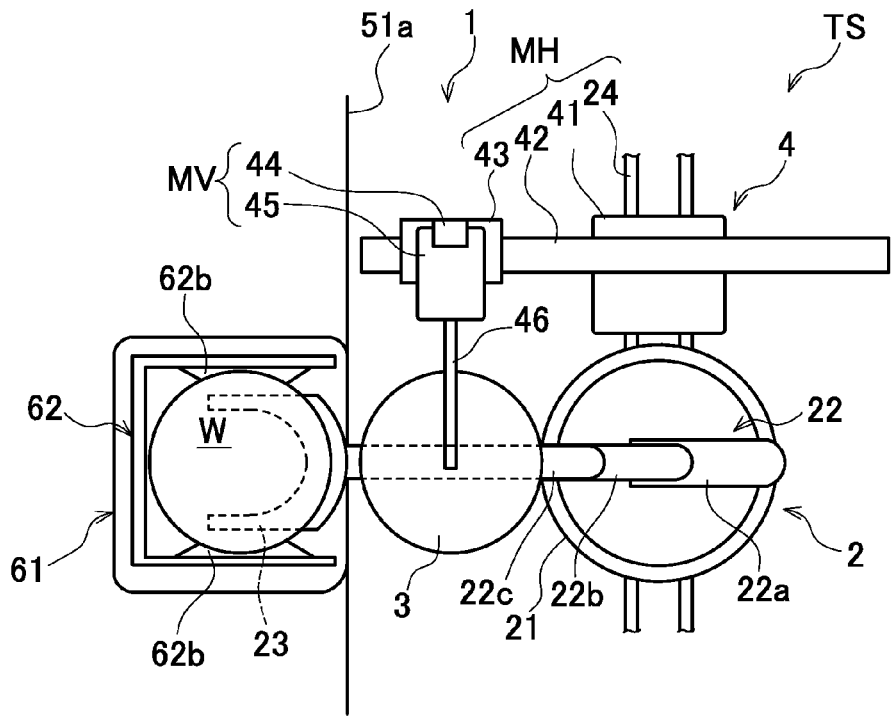
FIGS. 3(a) and (b) are explanatory views showing a positional relation with a cover when a transport arm in the substrate transport system is operated from the state shown in FIG. 2.
Figure 3B:
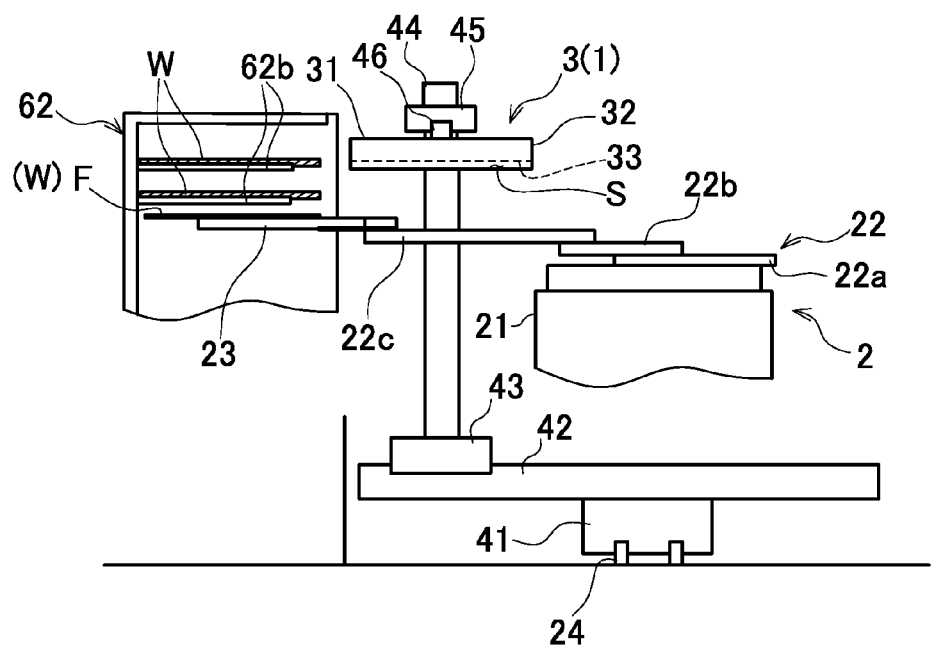

FIG. 2 and FIG. 3 are schematic diagrams showing an enlarged view of a wafer transport system TS in the embodiment. FIG. 2(a) is a plan view when each part is set to a reference position. FIG. 2(b) is a front view in that state. FIG. 3(a) is a plan view showing the state that a transport arm 22 described later extends so as to enter the FOUP 62. FIG. 3(b) is a front view in that state. Hereinafter, a configuration of the wafer transport system TS will be explained with reference to FIG. 2 and FIG. 3.

A wafer transport apparatus 2, constituting the wafer transport system TS with the atmosphere replacement apparatus 1, comprises a guide rail 24 arranged in a straight line on the bottom of the wafer transport chamber 5 to be parallel to the wall surface 51a, 51b (see FIG. 1), a base 21 that is supported on the guide rail 24 and movable along the guide rail 24, and a transport arm 22 supported on the base 21.

The transport arm 22 can be a variety of structures that is generally known. For example, it is possible to appropriately use a SCARA type horizontal articulated robot or a link type arm robot. In the embodiment, the transport arm comprises a plurality of arm elements 22a to 22c, and the entire transport arm 22 can be extended by moving them relatively. At the tip of the end arm element 22c, a U-shaped plate-like end effector 23 is provided to place a wafer W thereon. The transport arm 22 is able to pivot horizontally with respect to the base 21 so as to turn the end effector 23 in either direction of the wall surfaces 51a and 51b.

By configuring as above, the wafer transport apparatus 2 can move a wafer W placed on the end effector 23 constituting the transport arm 22 in two axes, in the directions parallel to and orthogonal to the wall surfaces 51a and 51b. Further, the base 21 can move up and down. By combining these movements, it is possible to lift the wafer W by the end effector 23, and to move the wafer W placed on the end effector 23 to a predetermined transfer position. In the EFEM in the embodiment, the FOUP 62 provided in a plurality of load ports 61 and the load lock chamber 81 (see FIG. 1) opposite to them are set as a transfer position for transferring the wafer W, and the wafer transport apparatus 2 can move the wafer W between them.

The atmosphere replacement apparatus 1 comprises broadly a cover 3 for supplying a gas G for replacing an atmosphere while covering the surface of the wafer W, and a cover support means 4 for supporting the cover 3.

The cover 3 is formed in a hood shape, including a disk-shaped main body part 31, and a wall part 32 extending downward from a peripheral edge of the main body part. The cover 3 is formed slightly larger than the wafer W in a plan view so as to cover the wafer W. Thus, it is possible to house the wafer W in the downwardly opened internal space S (see FIG. 13) formed by the main body part part 31 and the wall part 32, and opened downward.

The cover 3 can be a variety of structures as described later in detail. Here, a structure of a cover 3B shown in FIG. 13(b) is adopted. In other words, a gas supply port 34 is provided at the center of an upper surface 31b to enable to release the gas G supplied through the gas supply port 34 from a not-shown gas supply source downward, while diffusing by a diffusion plate 33. The gas supply source can selectively change supply and stop of the gas G to enable to supply the gas G only when necessary. It is possible to be configured to change a supply pressure and a flow rate. A gas supply means MG for supplying the gas G from the cover 3 is comprised of the gas supply source, and a gas G supply structure from the gas supply port 34 to diffusion plate 33 provided in the cover 3. Here, a nitrogen gas is used as the gas G.

Returning to FIG. 2 and FIG. 3, in addition to a base for the cover 41 that is supported by the guide rail 24 and movable along the guide rail 24, the cover support means 4 comprises a rail 42 for the cover, a movable block 43, a support bar 44, a lifting block 45, and a support arm 46, which are sequentially supported on the base for the cover.

In particular, on the base for the cover 41, the rail for the cover 42 is provided so as to extend in a horizontal direction orthogonal to the guide rail 24. The movable block 43 is supported movable on the rail for the cover 42. By configuring like this, the movable block 43 can move in a direction orthogonal to the wall surfaces 51a and 51b (see FIG. 1). On the movable block 43, the support bar 44 is provided standing upward and movable with the movable block 43. The support bar 44 is provided with the lifting block 45 movable in the vertical direction along the support bar 44, so that the support arm 46 extends from the lifting block 45 in parallel to the guide rail 24, and supports the center of the upper surface 31b of the main body part 31 constituting the cover 3 at the tip (see FIG. 13).

Further, as shown in FIG. 2(a), when the base for the cover 41 approaches the base 21 of the wafer transport apparatus 2, and the movable block 43 is set at a reference position located above the guide rail 24, the cover 3 supported by the support arm 46 is located right above the wafer transport apparatus 2. At this time, when the wafer transport apparatus 2 contracts the transport arm 22, and moves the wafer W supported on the end effector 23 onto the base 2, the wafer W is placed to be covered by the cover 3 in a plan view.

By configuring as above, it is possible to move the cover 3 in a direction parallel to the wall surfaces 51a and 51b by the base for the cover 41 and the guide rail 24, and in a direction vertical to the wall surfaces 51a and 51b by the rail for the cover 42 and the movable block 43. In other words, the base for the cover 41, the guide rail 24, the rail for the cover 42, and the movable block 43 constitute a cover moving means MH capable of operating the cover 3 to follow the wafer W moved by the transport arm 22. Further, it is possible to move the cover 3 in the vertical direction by the support bar 44 and the lifting block 45, so that the cover 3 approaches to or separates from a wafer surface F as a substrate surface formed by the surface of the wafer W. In other words, the support bar 44 and the lifting block 45 constitute a cover approach and separation means MV that approaches and separates the cover with respect to the wafer surface F.

By operating the wafer transport system TS comprising the atmosphere replacement apparatus 1 configured as described above under the control of a controller Cp (see FIG. 1), the wafer W can be transported in the following manner. The controller Cp is appropriately configured to control the entire EFEM, and moves the cover 3 in synchronization with the wafer transport apparatus 2 by the cover moving means MH and the cover approach and separation means MV, and can supply the gas G from the cover 3 by the gas supply means MG.

Figure 4:
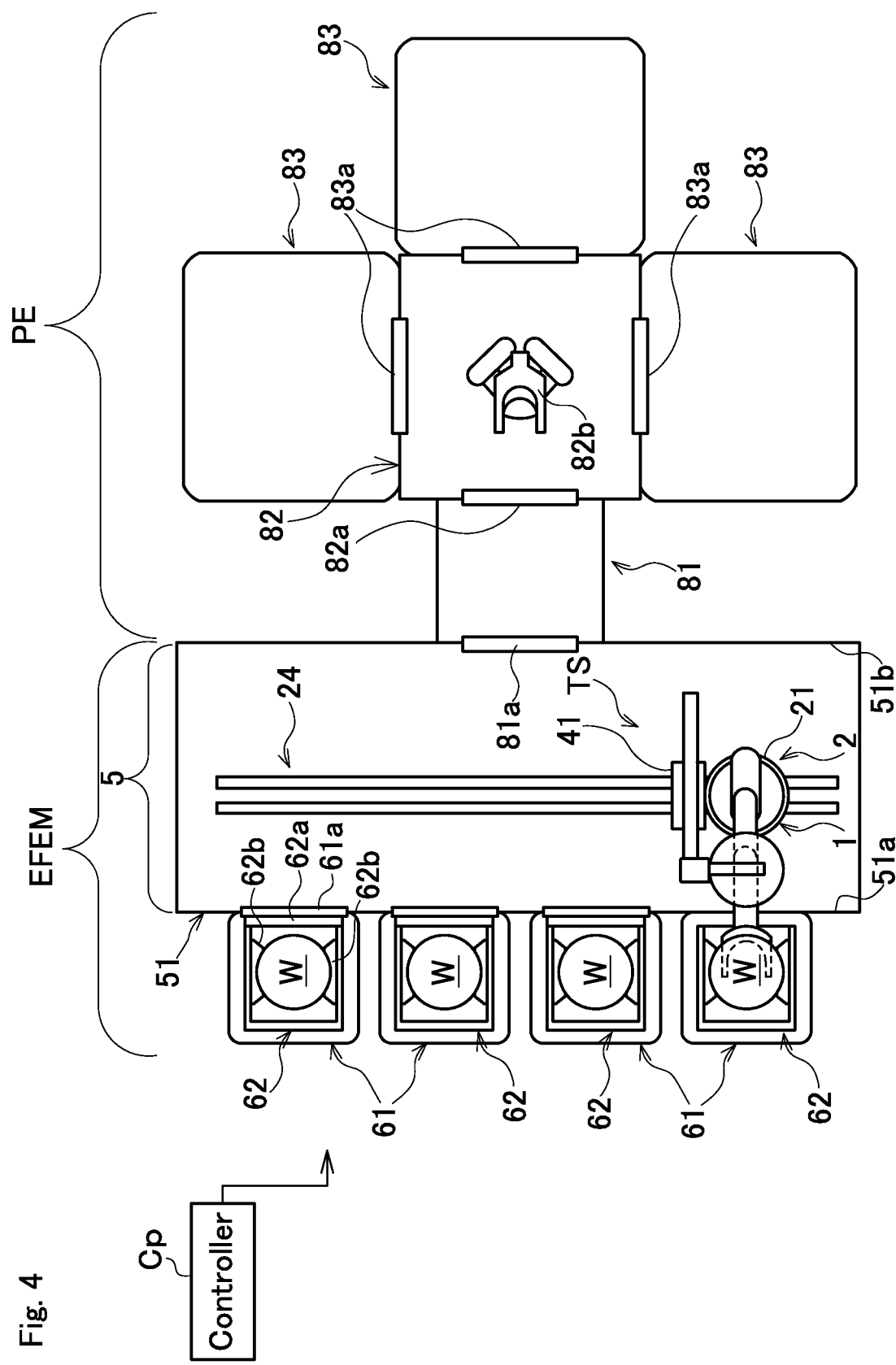
FIG. 4 is a plan view schematically showing the state that the transport arm of the substrate transport system is inserted into a FOUP.
Figure 5:
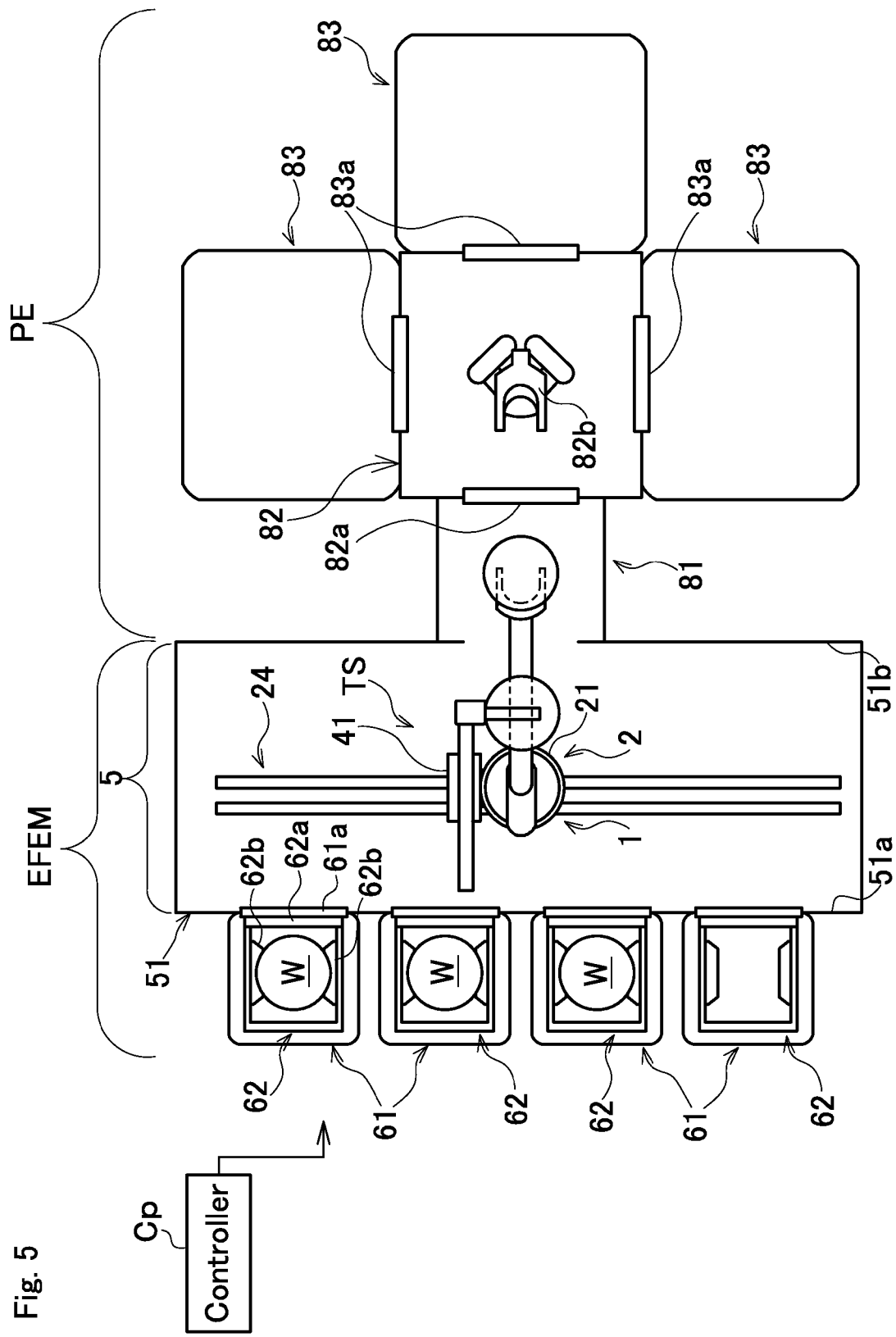
FIG. 5 is a plan view schematically showing the state that the transport arm of the substrate transport system is inserted into a load lock chamber.

As shown in FIG. 4, the wafer transport apparatus 2 constituting the substrate transport system TS moves the base 21 to the front of the FOUP 62, a target to take out the wafer W, along the guide rail 24, extends the transport arm 22 to insert the end effector 23 into the FOUP 62, and takes out the wafer W from the FOUP 62. And, as shown in FIG. 5, the wafer transport apparatus 2 moves the base 21 to the front of the load lock chamber 81, extends the transport arm 22 in the reverse direction to insert the end effector 23 into the load lock chamber 81, and transfers the wafer W. In a part of the transport route, while moving to follow and face the wafer W, the cover 3 can supply the gas G to the surface of the wafer W by the gas supply means MG (see FIG. 13), and can replace the atmosphere on the surface of the wafer W.

The above operation will be explained in detail by using FIG. 6 to FIG. 12.

Figure 6:
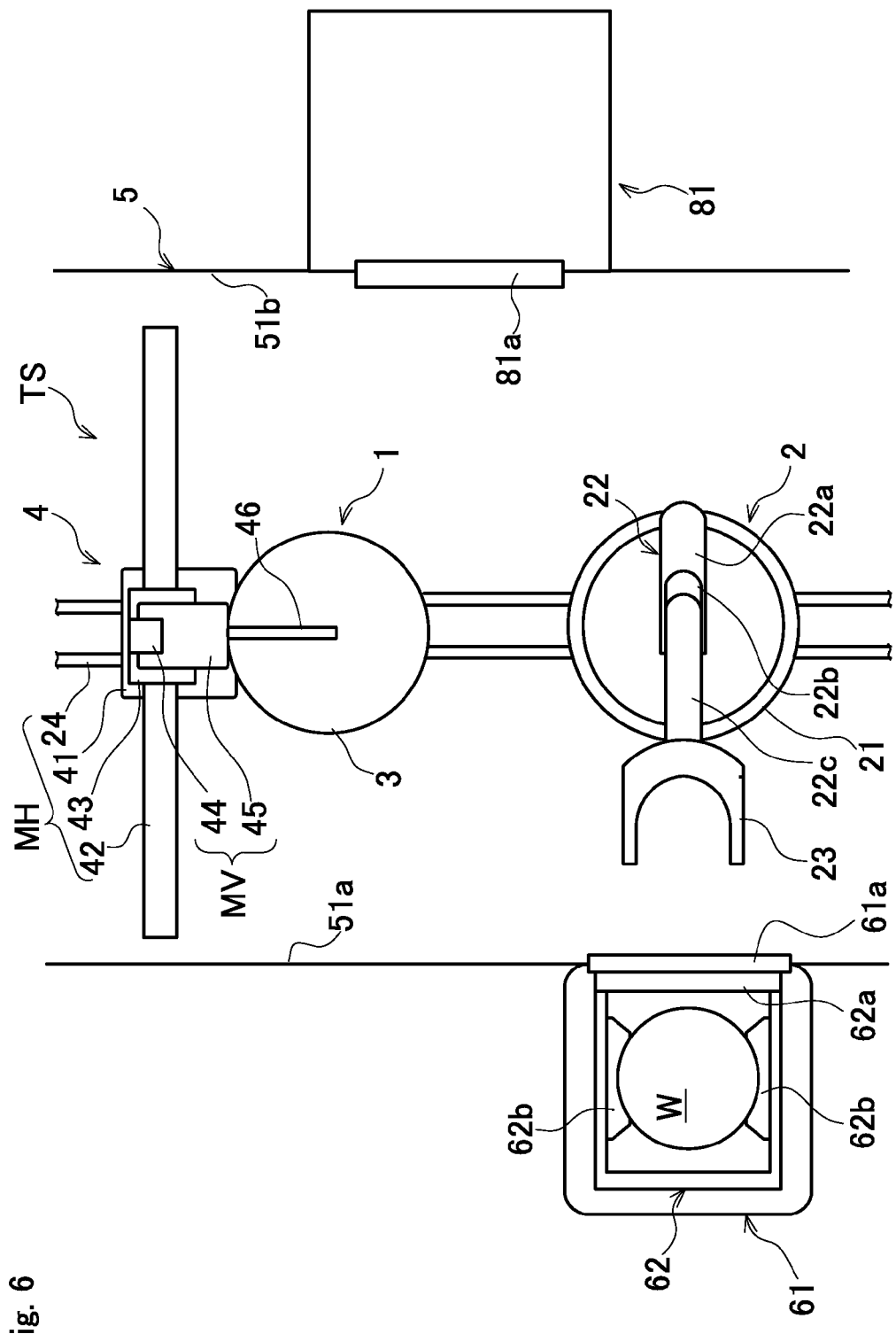
FIG. 6 is a plan view showing the state before the transport arm of the substrate transport system is inserted into a FOUP.

FIG. 6 shows the state that the base 21 of the wafer transport apparatus 2 moves along the guide rail 24 for transporting the wafer W, and the transport arm 22 is positioned before the load port 61 that is one transfer position. In the drawing, the other load port 61 that is not related to the transportation is omitted. Since the cover moving means MH can move the cover 3 independently of the base 21, the cover 3 can be set at an appropriate position. Since the base 21 is operable independently of the cover 3, the base can move accurately in lightweight.

Figure 7:
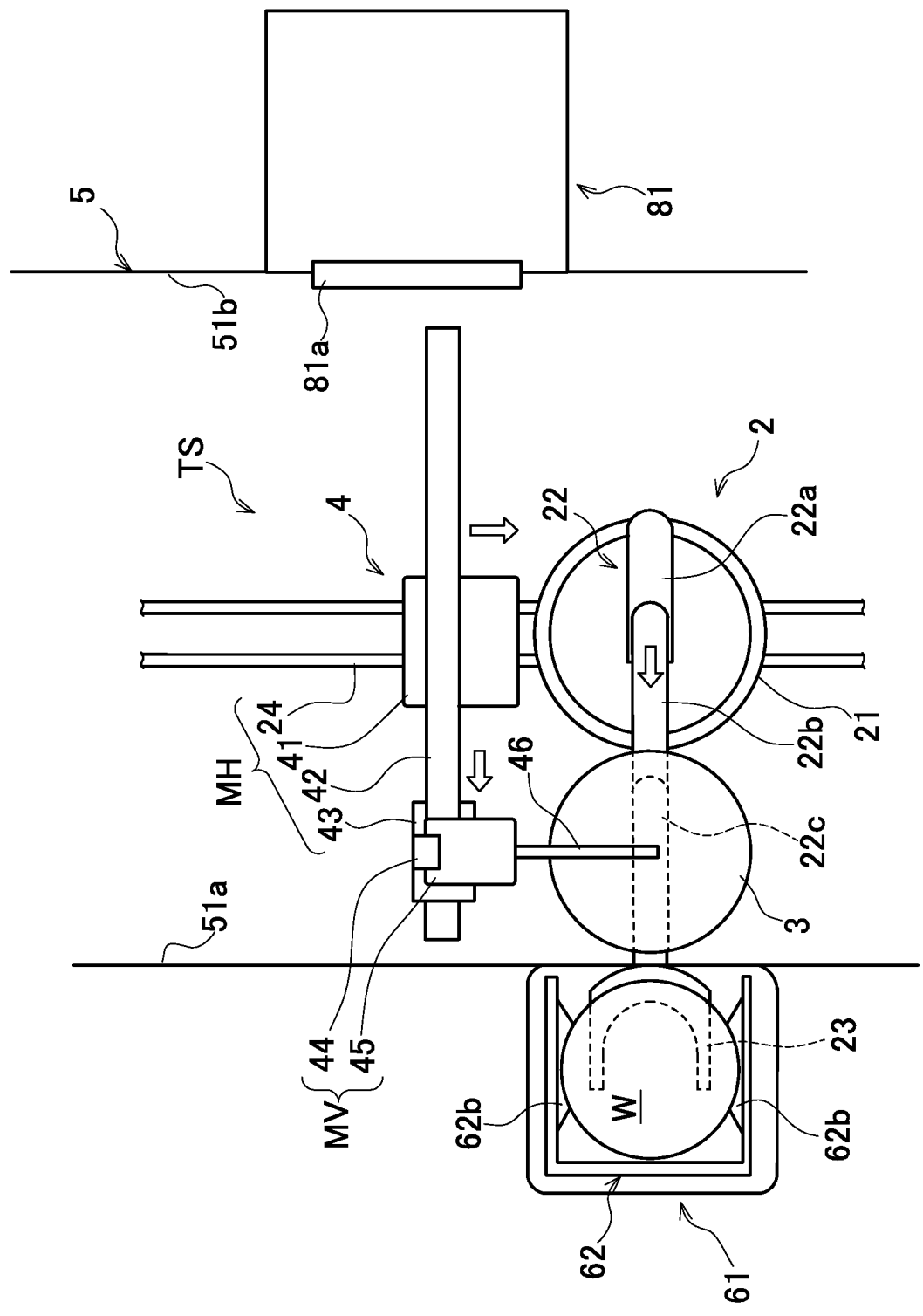
FIG. 7 is a plan view showing the state that the transport arm of the substrate transport system is inserted into a FOUP from the state of FIG. 6.

FIG. 7 shows the state that the door 61*a* of the load port 61 and the lid 62*a* of the FOUP 62 are open, and the transport arm 22 extends to insert the end effector 23 into the FOUP 62, from the state of FIG. 6. The end effector 23 enters with a small gap just below the wafer W to be taken out, and can lift and hold the wafer W by raising the base 21 a predetermined amount. In this state, the cover moving means MH moves the cover 3 to the front of the FOUP 62. At this time, the cover approach and separation means MV sets the open end 32*a* of the wall part 32 of the cover 3 (see FIG. 13) to a position higher than the upper surface of the wafer (the wafer surface F) placed on the end effector 23.

Figure 8:
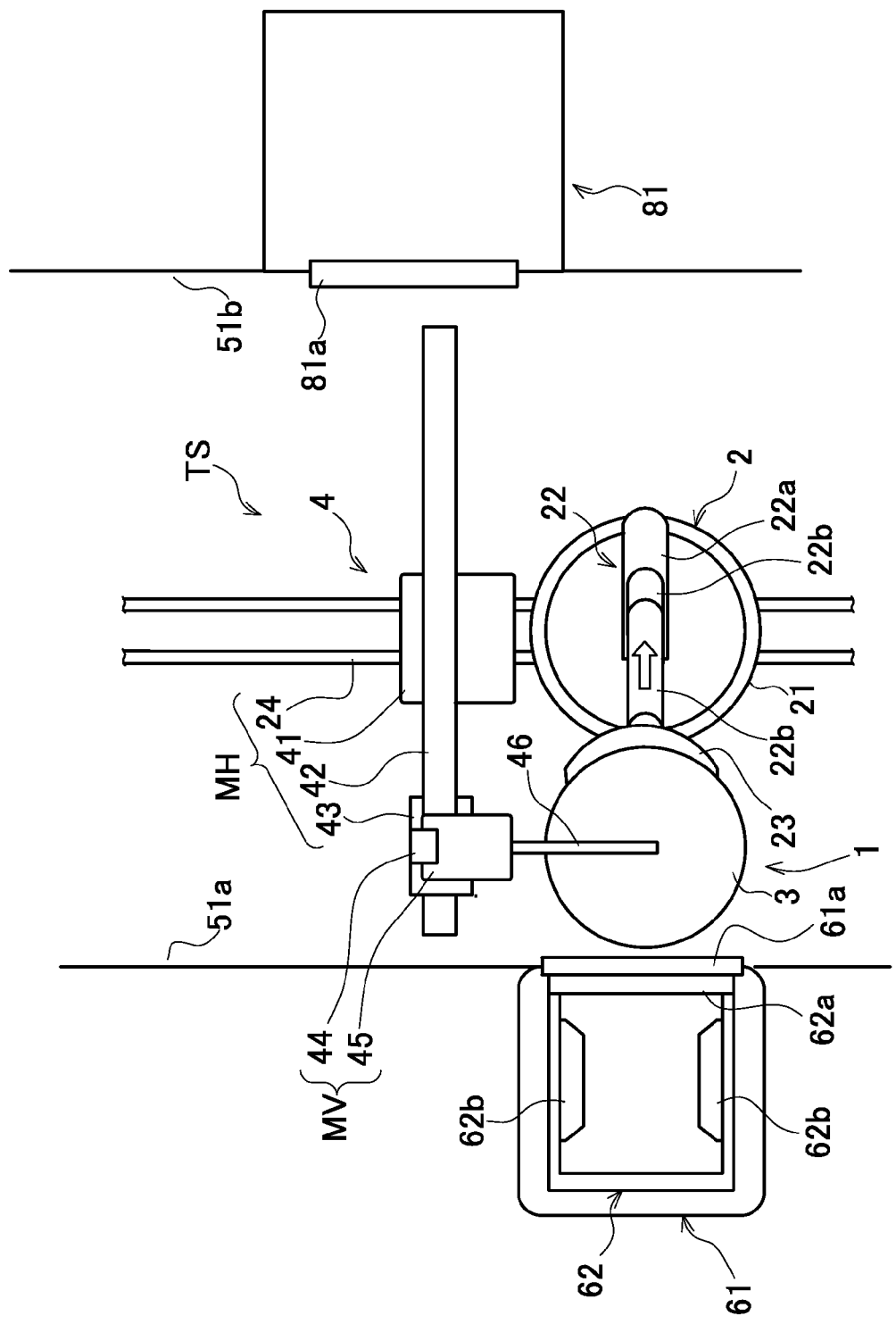
FIG. 8 is an explanatory drawing showing the state that the transfer arm takes out a wafer from a FOUP from the state of FIG. 7.

FIG. 8 shows the state that the transport arm 22 contracts from the state of FIG. 7 to take out the wafer W (see FIG. 7) from the FOUP 62. Since the cover 3 has been waiting in front of the FOUP 62, the cover 3 can face and cover the wafer W immediately after the wafer W is taken out to the front of the FOUP 62. In this state, the cover approach and separation means MV moves the cover 3 downward to house the upper part of the wafer W in the internal space S. Further, the gas supply means MG (see FIG. 13) starts supplying the gas G, and the atmosphere on the wafer W surface is replaced to the atmosphere of the gas G from the same air atmosphere as the atmosphere in the wafer transport chamber 5. The load port 61 closes the door 61*a* and the lid 62*a* of the FOUP 62 at a position where the wafer W does not interfere, and fills the FOUP 62 with a nitrogen gas, thereby preventing oxidation or adhesion of moisture on the surface of the housed wafer W other than the taken-out wafer W.

Figure 9:
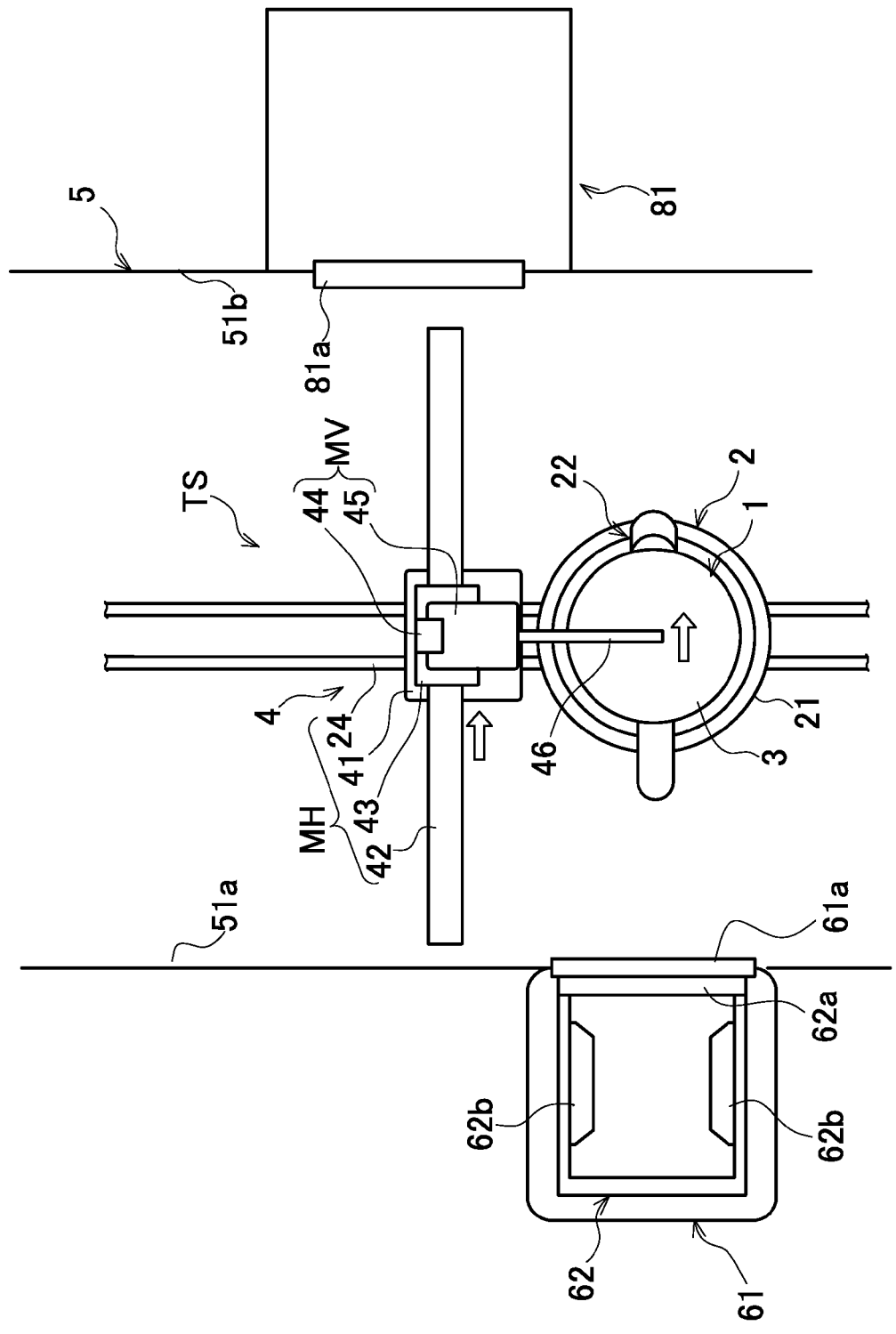
FIG. 9 is an explanatory drawing showing the state that a wafer is moved onto a guide rail from the state of FIG. 8.

FIG. 9 shows the state that the transport arm 22 contracts further from the state of FIG. 8 to position the end effector 23 (see FIG. 7) at the center of the base 21 in a plan view. In conjunction with the movement of the transfer arm 22 as described above, the cover moving means MH moves the cover 3. Thus, it is possible to replace the atmosphere on the wafer W surface (see FIG. 7) efficiently for a long time. Therefore, there is no wasting the time required to transport the wafer W.

Figure 10:
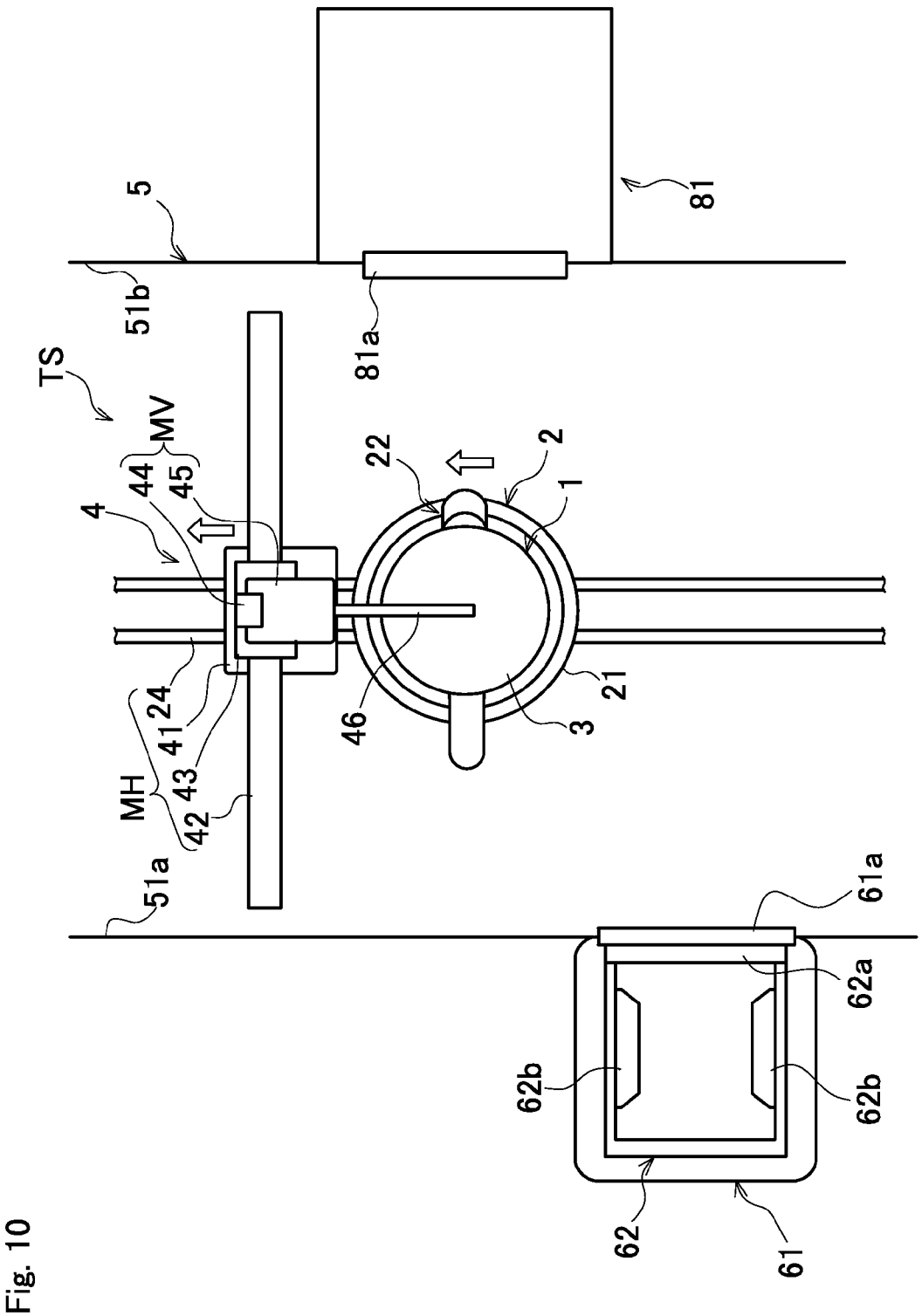
FIG. 10 is an explanatory drawing showing the state that the transport arm moves along the guide rail from the state of FIG. 9, and located at a position before the load lock chamber.

FIG. 10 shows the state that the base 21 moves from the state of FIG. 9 to the front of the load lock chamber 81 as the other transfer position. In conjunction with the movement of the base 21, the base 41 for the cover constituting the cover moving means MH can move on the guide rail 24, and can keep the cover 3 opposite to the wafer W (see FIG. 7). Thus, the gas G can be continuously supplied to the wafer W surface during the movement.

Figure 11:
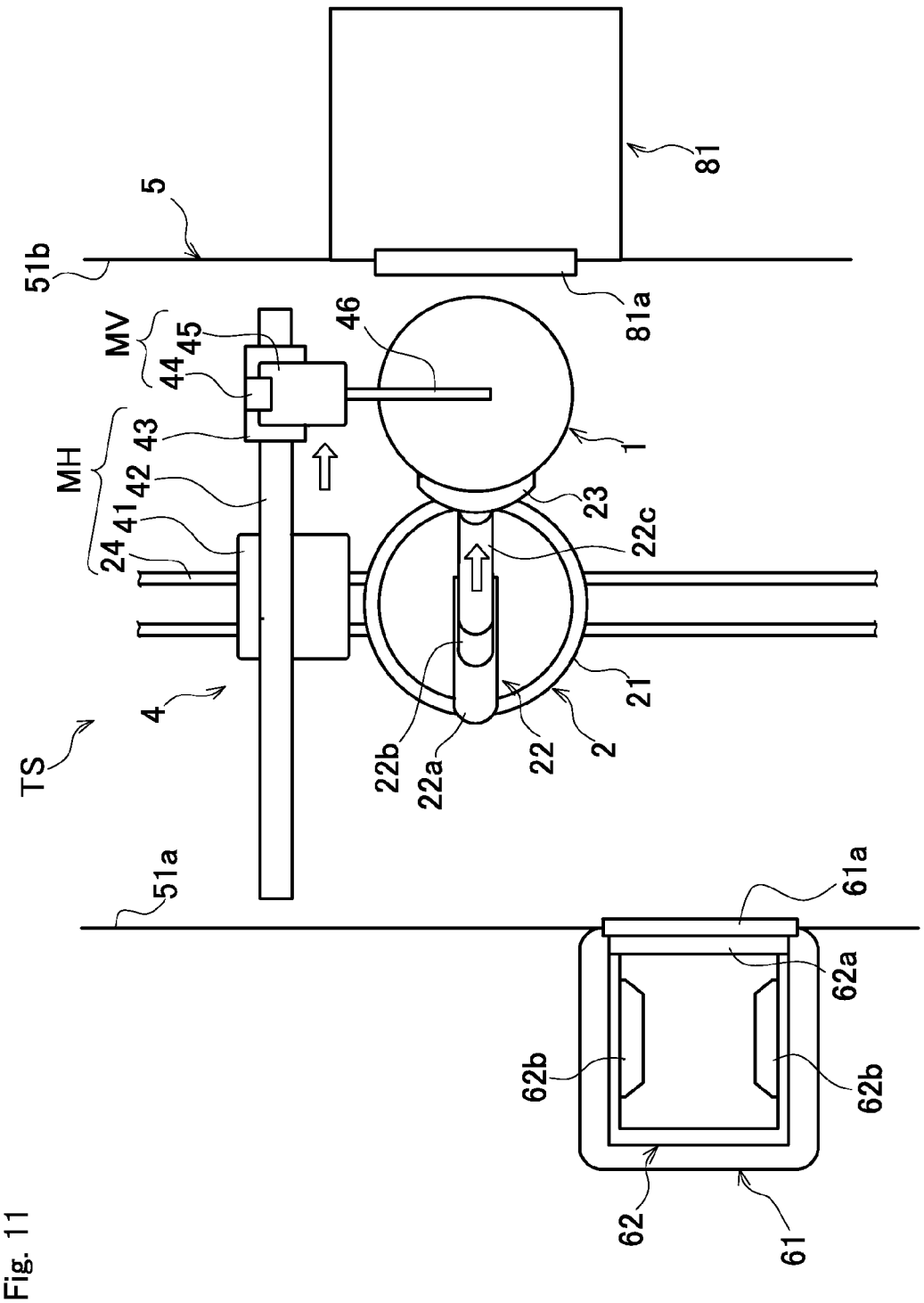
FIG. 11 is an explanatory drawing showing the state that the transport arm moves close to the load lock chamber from the state of FIG. 10.

FIG. 11 shows the state that the transport arm 22 extends into the load lock chamber 81 from the state of FIG. 10 to position the end effector 23 (see FIG. 7) to the front of the door 81*a* of the load lock chamber 81. At this time as well, the cover moving means MH causes the cover 3 to follow the wafer W (see FIG. 7) to keep the position opposite to the wafer W. Thus, the gas G can be continuously supplied to the wafer W surface.

Figure 12:
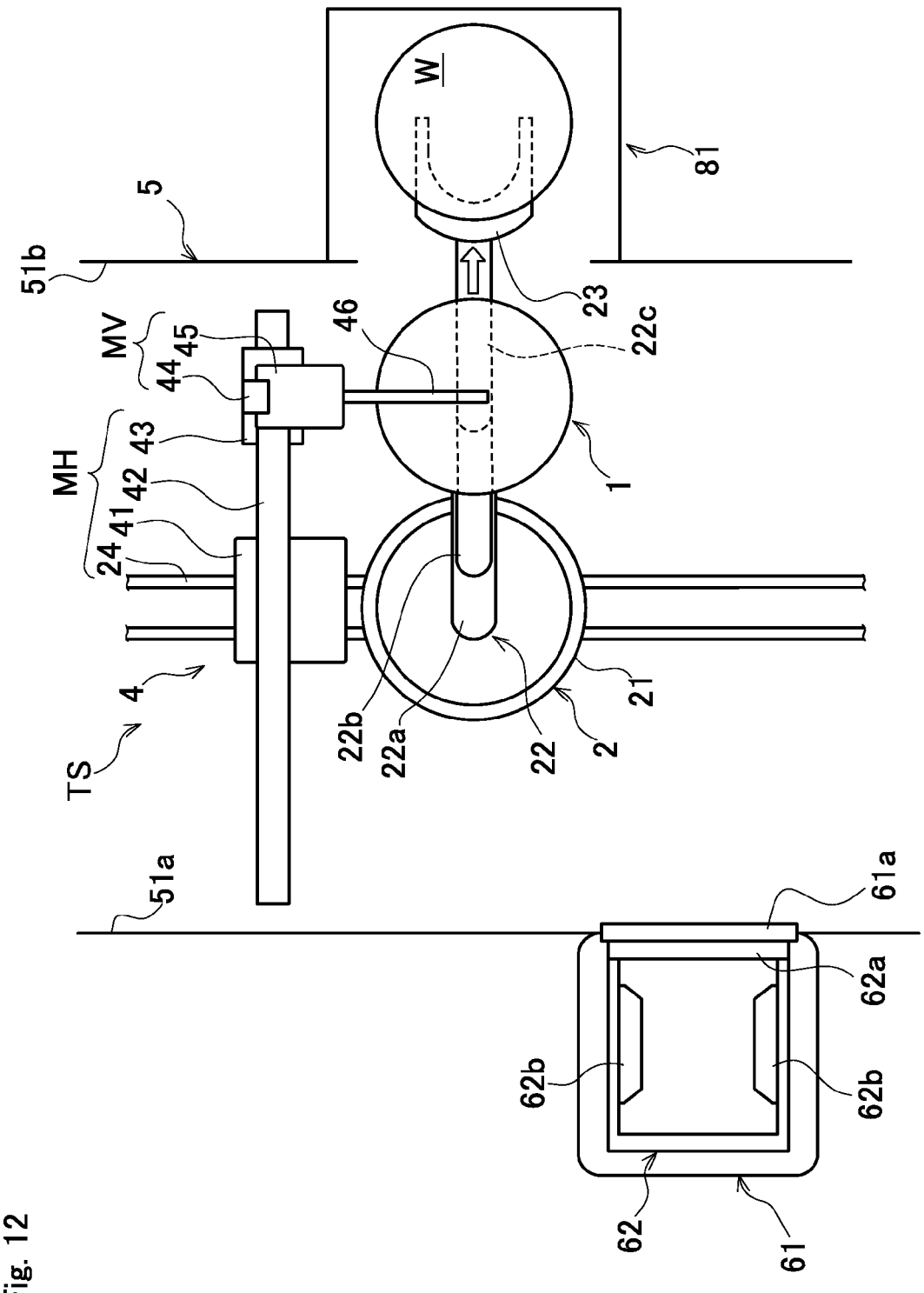
FIG. 12 is an explanatory drawing showing the state that the transport arm enters the load lock chamber from the state of FIG. 11.

FIG. 12 shows the state that the door 81*a* of the load lock chamber 81 is open, and the transport arm 22 extends further from the state of FIG. 11 to insert the end effector 23 into the load lock chamber. At this time, the cover 3 stops in front of the load lock chamber 81, and is lifted by the cover approach and separation means MV, so as not interfere with the load lock chamber 82, the wafer W, and the transport arm 22. In this state, the transport arm 22 is lowered by lowering the base 21, and the wafer W on the end effector 23 is transferred into the load lock chamber 81. At this time, the cover 3 may perform a preparatory operation to move in advance near the position where a wafer W to be next transported is present, for the next transport operation, independently of the movement of the transport arm 22. When transporting a wafer W that is unnecessary to replace the atmosphere on the surface, it is also possible to retract the cover 3 near the end of the guide rail 24.

As described above, by using the wafer transport system TS comprising the atmosphere replacement apparatus 1, when transporting a wafer W to the load lock chamber 81 from the FOUP 62, it is possible to maintain a proper surface state of the wafer W by replacing a local atmosphere around the wafer W surface via the cover 3, without replacing the entire atmosphere in the wafer transport chamber 5.

Further, when transporting a wafer W to the FOUP 62 from the load lock chamber 81, it is possible to replace a local atmosphere around the surface of the wafer W as well by reversely performing the operations of FIG. 6 to FIG. 12 described above.

Here, a specific structure of the cover 3 will be explained. It is possible to employ any type of cover 3A-3G shown in FIGS. 13 to 15, and use them selectively depending on a purpose.

Figure 13A:
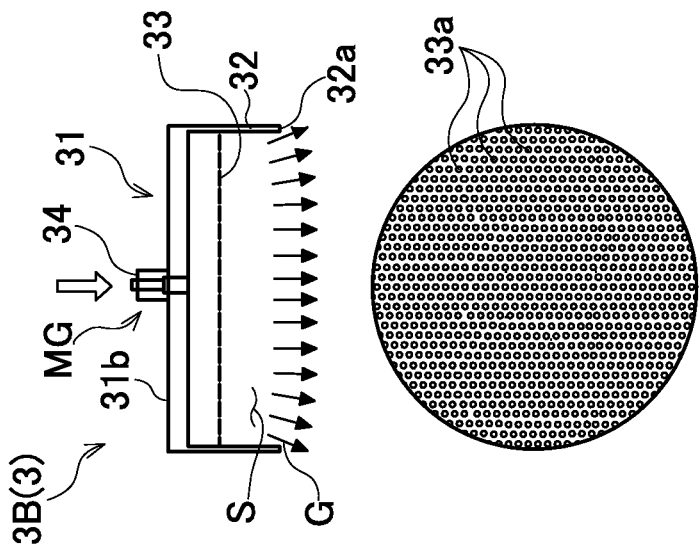
FIGS. 13(a) and (b) are explanatory drawings showing the structure of a cover constituting the atmosphere replacement apparatus.
Figure 13B:
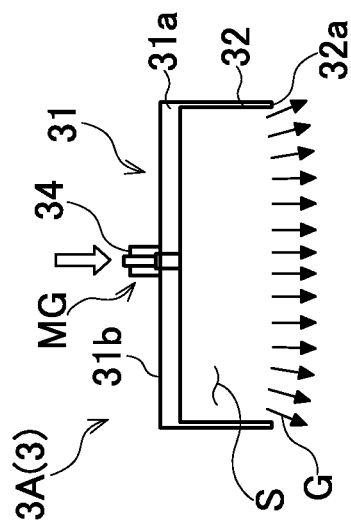

The cover 3A shown in FIG. 13(*a*) has a simple structure, and is formed by suspending the wall part 32 from the peripheral edge 31*a* of the aforementioned disk-shaped main body part 31. At the center of the upper surface 31, the gas supply port 34 configured similar to a common gas supply pipe opening is provided to enable to supply the gas G through the support arm 46 (see FIGS. 2 and 3). The gas supply port 34 communicates with the internal space S, and the supplied gas G can be released downward while filling the inner space. At this time, when a nitrogen gas is used as the gas G, because of its nature lighter than air, it is possible to increase the concentration of the nitrogen gas in the internal space S by excluding air easily from the internal space S. Thus, since the concentration of the nitrogen gas has been increased to a certain level or higher, the supply amount of the nitrogen gas may be reduced. Also in this way, it is possible to maintain the state that the atmosphere on the wafer W surface is replaced with the nitrogen gas.

The cover 3B shown in FIG. 13(b) is configured based on the structure of the cover 3A, and is provided with a diffusion plate 33 as a diffusion means below the main body part 31. The diffusion plate 33 has a large number of small holes 33a. By passing through the diffusion plate, the gas G is diffused substantially uniformly and released downward. Thus, when using the diffusion plate, it is possible to supply the gas G appropriately at any position on the wafer W surface.

Figure 14A:
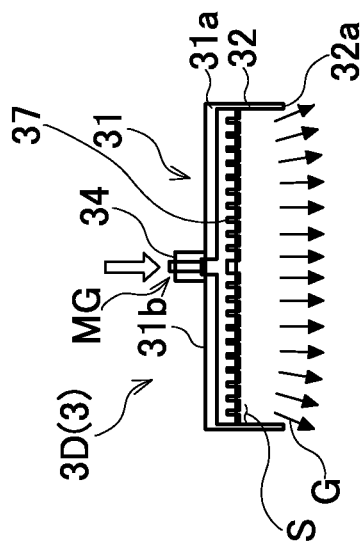
FIGS. 14(a) and (b) are explanatory drawings showing the structure of a cover different from FIG. 13.

The cover 3C shown in FIG. 14(a) is configured based on the structure of the cover 3A (see FIG. 13), and is provided with a heater 35 as a heating means inside the main body part 31. Being configured like this, it is possible to supply the gas G to the wafer W surface by heating the gas G, thereby increasing an atmospheric temperature of the wafer W surface. Thus, it is possible to eliminate moisture by increasing the temperature of the wafer W surface. Further, when a process of increasing the temperature inside the processing apparatus PE (see FIG. 1) is required, it is also possible to reduce the processing time by preheating.

Figure 14B:
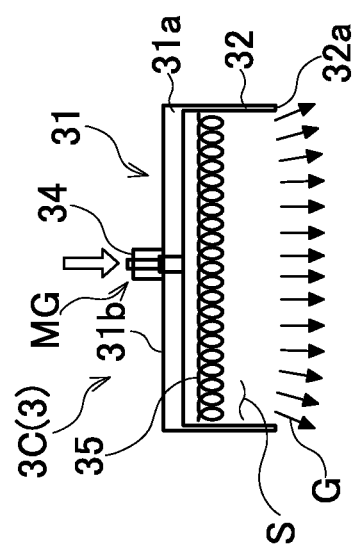

The cover 3D shown in FIG. 14(b) is configured based on the structure of the cover 3A (see FIG. 13), and is provided with a branch pipe 37 as a diffusion means for diffusing the gas G inside the main body part 31. Being configured like this, it is possible to uniformly diffuse and release the gas G, and supply the gas G properly at any position on the wafer W surface.

Figure 15A:
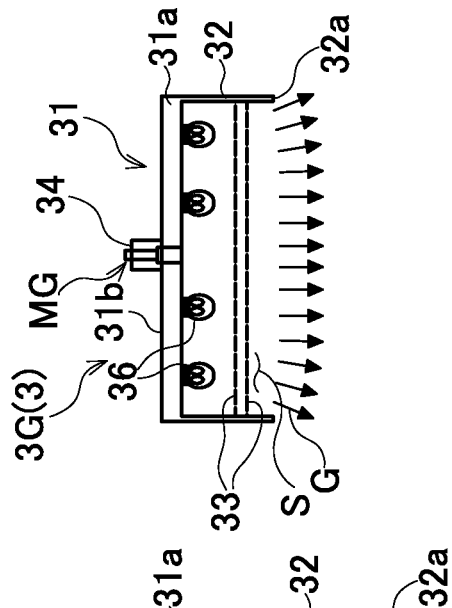
FIG. 15(a)-(c) are explanatory drawings showing the structure of a cover different from those shown in FIG. 13 and FIG. 14.

The cover 3E shown in FIG. 15(a) combines the structure of the cover 3B (see FIG. 13) and the structure of the cover 3C (see FIG. 14). Being configured like this, it is possible to heat, diffuse, and supply the gas G properly to the wafer W surface. As shown in this example, the diffusion plate 33 may be provided more than one (2 in the drawing), and it is possible to further diffuse and uniformly supply the gas G.

Figure 15B:
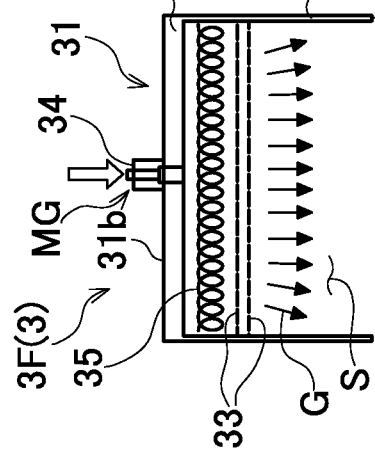

The cover 3F shown in FIG. 15(b) is configured based on the structure of the cover 3E, and the open end 32a of the wall part 32 extends downward. Being configured like this, the internal space S can cover not only the entire transport arm 22, but also the wafer W. Thus, it is possible to increase the concentration of the gas G filled in a space around the wafer W.

Figure 15C:
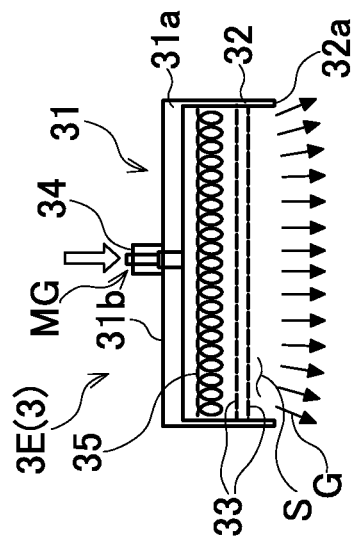

The cover 3G shown in FIG. 15(c) is configured based on the structure of the cover 3E, and the heating means is changed from the heater 35 to a heating lamp 36. Even in this structure, it is possible to heat, diffuse, and supply the gas G properly to the wafer W surface. Being configured such that light radiated from the heating lamp 36 reaches the wafer W, the temperature on the wafer W surface is directly increased without the gas G.

As described above, the atmosphere replacement apparatus 1 in the embodiment is configured to include the cover 3 able to face and cover a wafer W as a substrate to be transported, and the gas supply means MG that supplies the gas G having the properties different from those of the surrounding atmosphere from the cover 3, and replaces the atmosphere on the wafer W surface by the gas G.

Being configured as above, it is possible to face the cover 3 to the wafer W, supply the gas G, having the properties different from the surrounding atmosphere, to the wafer W surface from the cover 3, and replace the atmosphere around the wafer W surface. Thus, it is possible to avoid adverse effects on the wafer W surface by changing properly the surrounding atmosphere having an influence to the wafer W surface. In addition, as compared with the case of replacing all the surrounding atmospheres, it is possible to reduce the supply amount of gas G, and reduce the cost and time required for replacing the atmosphere. Further, even when the gas G leaks to the surroundings, as the amount of gas is small, it is possible to suppress deterioration in the working environment.

Further, the atmosphere replacement apparatus 1 in the embodiment is configured to be used in a wafer transport system TS as a substrate transport system that transports a wafer W between multiple transfer positions by the wafer transport apparatus 2 as a substrate transport apparatus. The apparatus 1 is further provided with a cover moving means MH that supports the cover 3 movable independently of the wafer transport apparatus 2, and is configured such that when the wafer transport apparatus 2 transports a wafer W, the cover moving means MH moves the cover 3 to a position opposite to the wafer.

Being configured as described above, it is possible to move the cover 3 so as to face the wafer W transported by the wafer transport apparatus 2 by using the cover moving means MH, supply the gas G having the properties different from the surrounding atmosphere to the wafer W surface from the cover 3, and replace the atmosphere around the wafer W surface with the gas G. Thus, it is possible to avoid adverse effects on the wafer W surface by changing properly the surrounding atmosphere having an influence upon the wafer W surface. In addition, as compared with the case of replacing all the surrounding atmospheres, it is possible to reduce the supply amount of gas G, and reduce the cost and time required for replacing the atmosphere. Further, even when the gas G leaks to the surroundings, as the amount of gas is small, it is possible to suppress deterioration in the working environment. Further, since the cover moving means MH can move the cover 3 independently of the wafer W, it is possible to perform a preparatory operation for a wafer W to be next transported, and retract to be unused when the supply of gas G is unnecessary. This enables more efficient use.

Being configured to include a cover approach and separation means MV that approaches or separates the cover 3 from the wafer surface F as a substrate surface, it is possible to prevent interference with the wafer W and the transport arm 22 constituting the wafer transport apparatus 2. In addition, it is also possible to replace the atmosphere around the wafer W surface with a small amount of gas G by approaching the cover according to the transportation state.

Further, as the cover 3 is configured to comprise the main body part 31 capable of facing a wafer W, and the wall part 32 provided on the periphery of the main body part 31, and the wafer W can be housed in the internal space S formed between the main body part 31 and the wall part 32, when the cover approach and separation means MV moves the cover 3 close to the wafer W. Thus, it is possible to reduce the supply amount of gas G by decreasing the amount of the gas G leaking to the parts other than the wafer W surface by supplying the gas G in the state that the wafer W is housed in the internal space S.

Further, as the gas supply means MG is configured to include the gas inlet port 34 for introducing the gas G from outside, and the diffusion plate 33 or the branch pipe 37 as a diffusion means for diffusing the gas G downward the cover 3 from the gas inlet port 34, it is possible to replace efficiently the atmosphere on the surface of a wafer W by effectively diffusing and efficiently supplying the gas G to the entire surface of the wafer W, while making the structure of the gas inlet port 34 as simple as a general piping.

Further, as the gas supply means MG is configured to include the heater 35 or the heating lamp 36 as a heating means for heating the gas G, it is possible to increase the temperature of the wafer W surface by heating the supplied gas G, and it is also possible to eliminate moisture. When temperature increases is necessary in the processing apparatus PE, it is possible to reduce the processing time by pre-heating.

Further, the wafer transport system TS, as a substrate transport system in the embodiment, comprises the atmosphere replacement apparatus 1 configured as described above, and the wafer transport apparatus 2, and the cover moving means MV is configured is configured to use the guide rail 24 constituting a part of the wafer transport apparatus 2. It is possible to reduce the installation space of the entire equipment, while reducing the overall production costs. It is also possible to configure by easily adding to an existing EFEM that is provided only the wafer transport apparatus 2.

Further, being configured to use a wafer W as a substrate, and to include the wafer transport system TS, and the housing 51 for housing the wafer transport system TS, and to set the load port 61 and the load lock chamber 81 as a transfer position adjacent to the wall surfaces 51a and 51b of the housing 51, it is possible to configure as an effective EFEM that performs transfer between the transfer positions while maintaining the suitable atmosphere on the wafer W surface, by using the wafer transport system TS provided in the housing 51.

Second Embodiment

FIG. 16 is a schematic view showing an atmosphere replacement apparatus 101 of the second embodiment. Also in this case, the atmosphere replacement apparatus 101 constitutes the wafer transport system TS as a substrate transport system, and the wafer transport apparatus 2 as a substrate transport apparatus. In the drawing, the same parts as those in the first embodiment are denoted by the same reference numerals, and the explanation thereof is omitted.

In the embodiment, the wafer transport apparatus 2 is the same as that explained in the first embodiment, except the structure of the atmosphere replacement apparatus 101.

FIG. 16(a) schematically shows the positional relationship of the wafer transport system TS when viewed from a direction that the guide rail 24 (see FIG. 1) constituting the wafer transport apparatus 2 extends.

The atmosphere replacement apparatus 101 is supported in a state being suspended from a ceiling surface 51 provided in a housing 51 constituting a wafer transport chamber 5 via a cover support means 104. The cover support means 104 comprises a cover moving means MH that moves the cover 3 horizontally along the guide rail 24 (see FIG. 1), and a cover approach and separation means MV that approaches or separates the cover 3 from a wafer surface F by moving the cover 3 in a vertical direction.

The cover 3 comprises a main body part 131, and a wall part 132 that is provided on a periphery of the main body part part and suspended therefrom. These parts of the cover form an internal space S opened downward. A gas supply port 134 is provided at the center of the upper surface 131b to enable to supply the gas G via a cover support means 104. The main body part 131 includes a diffusion plate 33 to enable to diffuse and supply the gas G downward.

Further, as shown in FIG. 16(b), when the transport arm 22 contracts and positions a wafer W with an end effector 23 on a base 21, the cover 3 covers the entire transport arm 22 to contain in the internal space S. Thus, it is possible to increase the concentration of gas G around the wafer W, and enhance the effect by the replacement of atmosphere.

Even when configuring as above, being provided with the atmosphere replacement apparatus 101 comprising the cover 3 that is able to face and cover a wafer W to be transported, and the gas supply means MG that supplies a gas G different from a surrounding atmosphere from the cover 3, and replaces the atmosphere on the surface of the wafer W with the gas G, it is possible to obtain the same effect as the first embodiment, and further increase the independence of the atmosphere replacement apparatus 101 and the wafer transport apparatus 2.

In other words, as the embodiment is configured to comprise the wafer transport system TS that includes the atmosphere replacement apparatus 101 and the wafer transport apparatus 2, and the housing 51 for covering the substrate transfer system TS, wherein a wafer W is used as a substrate, the cover moving means MH is supported on the ceiling surface 51c provided in the housing, and the load port 61 and the load lock chamber 81 are set as a transfer position adjacent to the wall surfaces 51a and 51b of the housing 51, it is possible to be configured as an effective EFEM that can transport a wafer W by easily moving the atmosphere replacement apparatus 101 with a high degree of freedom without interfering with the wafer transport apparatus 2 provided in the housing 51.

Third Embodiment

Figure 17:
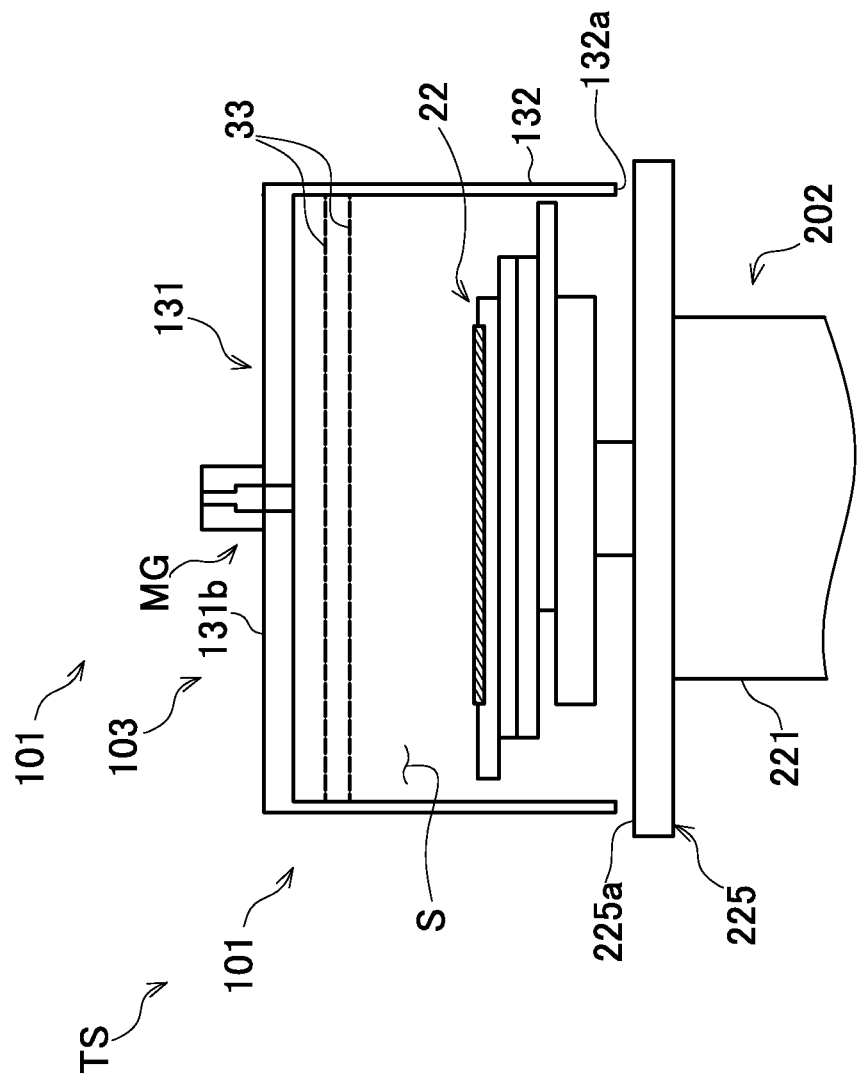
FIG. 17 is an explanatory drawing showing the structure of a substrate transport system according to a third embodiment of the invention.

FIG. 17 schematically shows a configuration of a wafer transport system TS in the third embodiment. In the drawing, the same parts as those in the first and second embodiments are denoted by the same reference numerals, and the explanation thereof is omitted. The wafer transport system TS is a modified from the structure of the wafer transport apparatus 202 by using the atmosphere replacement apparatus 101 explained in the second embodiment.

In particular, a disk-shaped cover receiving member 225 is provided on the base 221 that constitutes a wafer transport apparatus 202 and supports a transport arm 22. The cover receiving member 225 has a diameter slightly larger than the cover 103 in a plan view to enable to substantially close the internal space S in cooperation with the cover, when the cover 103 moves downward, and an open end 132a of a wall part 132 in the cover 103 approaches the upper surface 225a of the cover receiving member 225. Thus, it is possible to further increase the concentration of gas G, when the gas G is supplied to the internal space S, and increase the effect by the replacement of atmosphere.

Of course, it is permitted to make contact between the open end 132a and the upper surface 225a. By contacting and sealing the both after the atmosphere is replaced with the gas G, the atmosphere replaced state can be maintained even after the supply of the gas G is stopped, and the wafer W surface is not contaminated.

Even when configuring as above, being provided with the atmosphere replacement apparatus 101 comprising the cover 3 that is able to face and cover a wafer W to be transported, and the gas supply means MG that supplies a gas G different from a surrounding atmosphere from the cover 3, and replaces the atmosphere on the surface of the wafer W with the gas G, it is possible to obtain the same effect as the first embodiment and the second embodiment. In addition, since the wafer transport apparatus 202 is configured to include the cover receiving member 225 that can substantially close the internal space S in cooperation with the cover, when the cover 103 approaches the wafer W, and the open end 132a of the wall part 132 of the cover 103 approaches or contacts the cover receiving member, a substantially closed space is formed between the cover 103 and the cover receiving member 225, and the supply amount of gas G can be further reduced by housing the wafer W into the space.

Fourth Embodiment

Figure 18:
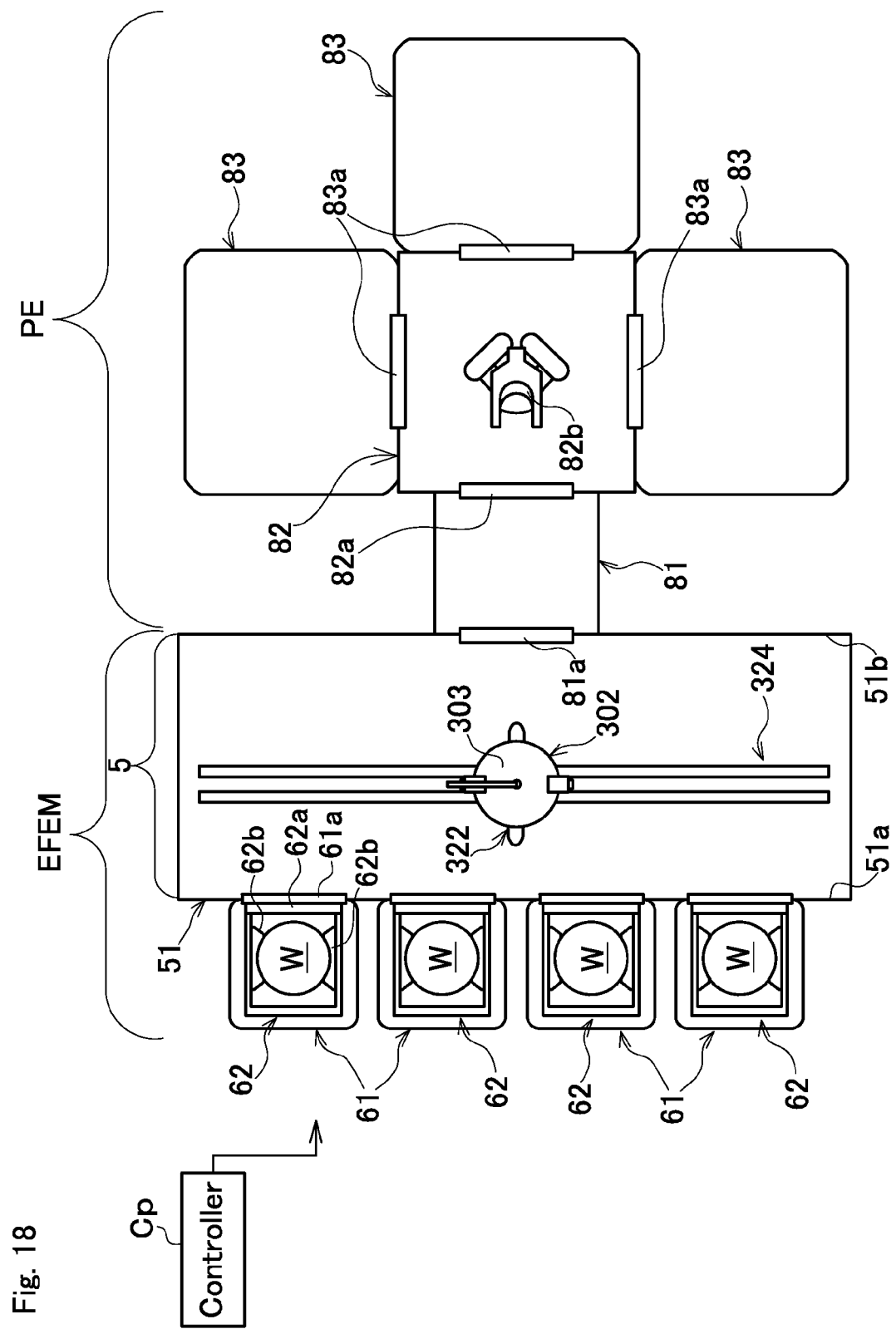
FIG. 18 is a plan view schematically showing a positional relationship between a processing apparatus and an EFEM comprising a wafer transport apparatus according to a fourth embodiment of the invention.

A substrate transport apparatus of the fourth embodiment is, as shown in FIG. 18, configured as a wafer transport apparatus 302, and transports a wafer W as a substrate. In the drawing, the same parts as those in the first to third embodiments are denoted by the same reference numerals. A wafer transport chamber 5 is configured to be substantially closed by a housing 51. A plurality of load ports 61 (four in the drawing) is provided adjacent to one wall surface 51a of the housing. The load ports and the wafer transport apparatus 302 configure an EFEM. The drawing schematically shows the state that a FOUP 62 is placed on the load port 61. Each load port 61 has a door 61a. As the door 61a moves in conjunction with a lid 62a of the FOUP 62, the FOUP 62 is opened to the wafer transport chamber 5. In the FOUP 62, a plurality of placing portions 62b for supporting one wafer W in pairs is provided in the vertical direction. By using them, a plurality of wafers W can be stored. A nitrogen gas can be filled in the FOUP 62, and the atmosphere in the FOUP can be replaced with nitrogen via the load port 61.

The wafer transport chamber 5 constituting an EFEM can be connected to the load lock chamber 81 which constitutes a part of a processing unit PE adjacent to the wall surface 51b that faces the load port 61. By opening a door 81a of the load lock chamber 81, the load lock chamber 81 can communicate with the wafer transport chamber 5. A variety of configurations can be used as a processing unit PE. Generally, a transport chamber 82 is provided adjacent to the load lock chamber 81, and a plurality of processing units 83 (three in the drawing) is provided adjacent to the transport chamber 82. A door 82a is provided between the load lock chamber 81 and the transport chamber 82, and a door 83a is provided between a processing unit 83 and the transport chamber 82. By opening the doors, the chambers and the unit can communicate each other, and a transport robot 82b provided within the transport chamber 82 can transfer a wafer W between the load lock chamber 81 and the processing unit 83.

Figure 20A:
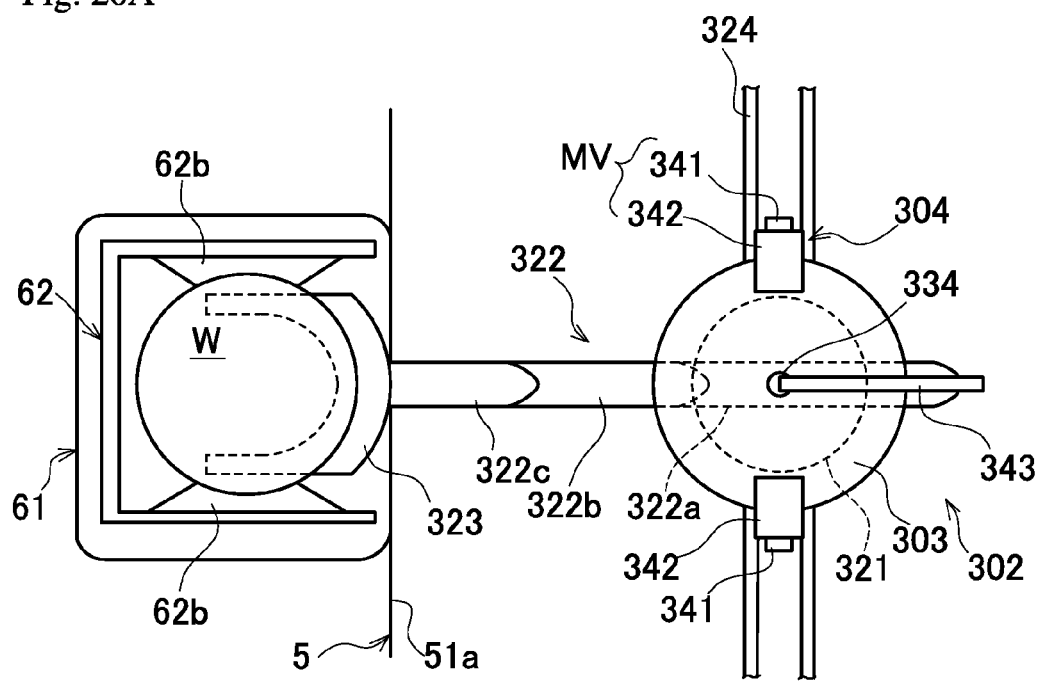
FIGS. 20(a) and (b) are explanatory drawings showing the state that the transport arm is operated from the state of FIG. 19.
Figure 20B:
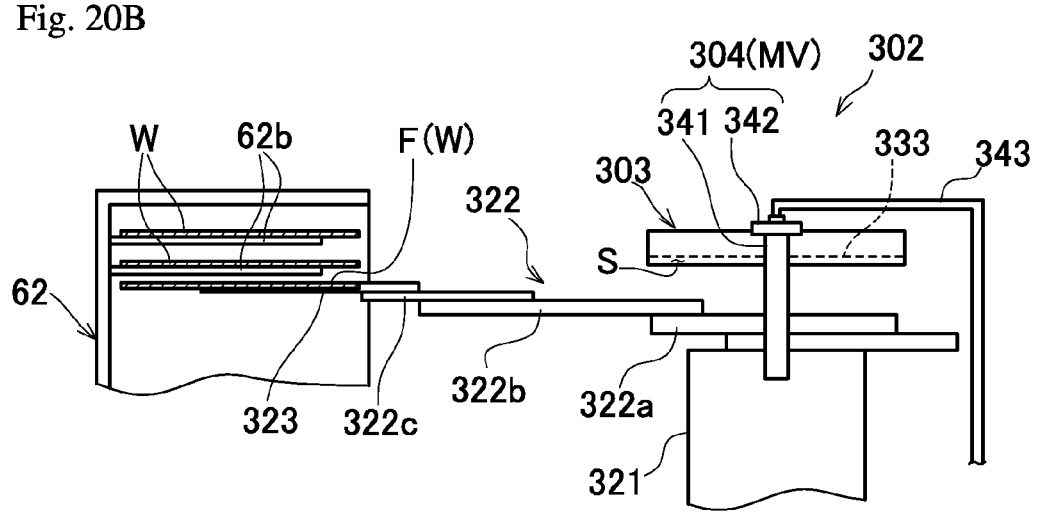

FIG. 19 and FIG. 20 are schematic diagrams showing an enlarged view of a wafer transport apparatus 302 in the embodiment. FIG. 19(a) is a plan view when each part is set to a reference position. FIG. 19(b) is a front view in that state. FIG. 20(a) is a plan view showing the state that a transport arm 322 described later is extended to enter the FOUP 62. FIG. 20(b) is a front view in that state. Hereinafter, the configuration of the wafer transport apparatus 302 will be explained with reference to FIG. 19 and FIG. 20.

The wafer transport apparatus 302 comprises a guide rail 324 arranged in a straight line on the bottom of the wafer transport chamber 5 to be parallel to the wall surface 51a, 51b (see FIG. 18), a base 321 that is supported on the guide rail 324 and movable along the guide rail 324, and a transport arm 322 supported on the base 321, and a cover 303 that is supported by a cover support means 304 above the transport arm 322.

The transport arm 322 can be a variety of structures that are generally known. For example, it is possible to appropriately use a SCARA type horizontal articulated robot or a link type arm robot. In the embodiment, the transport arm comprises a plurality of arm elements 322a to 322c, and the entire transport arm 322 can be extended by moving them relatively. At the tip of the end arm element 322c, a U-shaped plate-like end effector 323 is provided to enable to mount a wafer W thereon. The transport arm 322 is able to pivot horizontally with respect to the base 321 so as to turn the end effector 323 in either direction of the wall surfaces 51a and 51b.

By configuring as above, the wafer transport apparatus 302 can move the wafer W placed on the end effector 323 constituting the transport arm 322 in two axes in the directions parallel to and orthogonal to the wall surfaces 51a and 51b. Further, the base 321 can move up and down. By combining these movements, it is possible to lift the wafer W with the end effector 323, and to move the wafer W placed on the end effector 323 to a predetermined transfer position. In other words, the base 321 in the embodiment is configured to support the transport arm 322 on the guide rail 324, and at the same time, it is configured to cause the transport arm 322 to move along the guide rails 324, and to contract/extend and move up/down toward the wall surfaces 51a and 51b, by using an actuator (not shown) incorporated inside. In the EFEM in the embodiment, the FOUP 62 provided in a plurality of load ports 61 and the load lock chamber 81 (see FIG. 18) opposite to them are set as a transfer position for transferring the wafer W, and it is possible to move the wafer W between them by using the wafer transport apparatus 302.

The wafer transport apparatus 302 in the embodiment is particularly characterized by comprising the cover 303 provided on the transport arm 322, as described above, and the cover support means 304 that supports the cover 303 on the base 321.

The cover 303 is formed in a hood shape, including a disk-shaped main body part 331, and a wall part 332 extending downward from a peripheral edge of the main body part. The cover 3 is formed slightly larger than the wafer W in a plan view to be able to cover the wafer W. Thus, it is possible to house the wafer W in the internal space S (see FIG. 24) that is formed by the main body part 331 and the wall part 332, and opened downward.

The cover 303 can be a variety of structures as described later in detail. Here, the structure of a cover 303B shown in FIG. 24(b) is adopted. In other words, a gas supply port 334 is provided in the middle of the upper surface 331b, so that a gas G supplied through the gas supply port 334 from a not-shown gas supply source can be released downward while diffusing by a diffusion plate 333. A gas supply source can selectively change supply and stop of the gas G, and can supply the gas G only when necessary. It is possible to configure to change a supply pressure and a flow rate. A gas supply means MG for supplying the gas G from the cover 303 comprises a gas supply source, and a gas G supply structure in the cover 303, from the gas supply port 334 to the diffusion plate 333. Here, a nitrogen gas is used as the gas G.

Returning to FIG. 19 and FIG. 20, the cover support means 304 comprises a pair of support bars 341 that is separated in the extending direction of the guide rail 324 and erected from the base 321 at an appropriate position not to interfere with the transport arm 322, and lifting blocks 342 supported by the support bars 341 movable in a vertical direction. The lifting blocks 342 supports the upper surface 331b of the main body part 331 of the cover 303 (see FIG. 24).

Figure 21A:
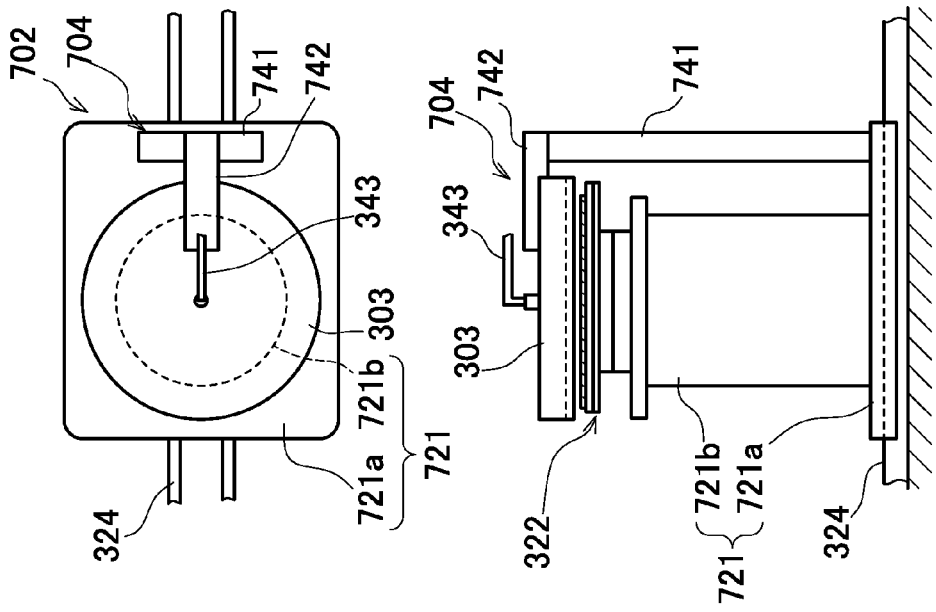
FIGS. 21(a) and (b) are explanatory drawings for explaining a cover support means in the wafer transport apparatus of FIG. 19.

FIG. 21(a) shows the wafer transport apparatus 302 of FIGS. 19(a) and (b) viewed from a different angle of 90°. The base 321 is supported movable on the guide rail 24 as described above, supports the transport arm 322, and enables the transport arm 322 to extend/contract and move up/down. The pair of support bars 341 extends from the side of the base 321 toward the direction along the guide rail 324, and stands upward. The upper parts of the support bars 341 support the lifting blocks 342.

Figure 21B:
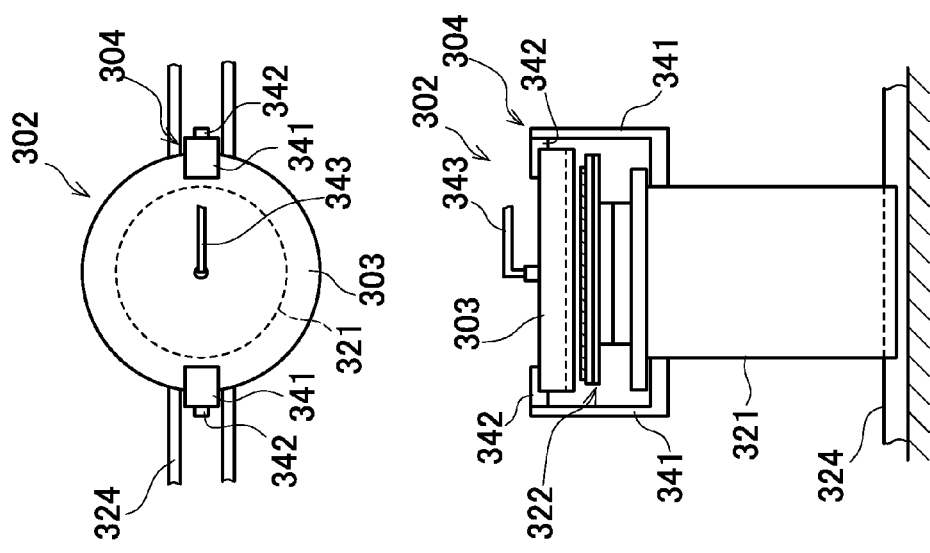

Instead of the above configuration, it is allowed to have the structure of a wafer transport apparatus 702 as shown in FIG. 21(b). In other words, a base 721 comprises a liner motion plate part 721a including a moving mechanism along the guide rail 324, and a main body part 721b including a mechanism for performing extension/contraction and lifting operation of the transport arm 322. A cover support means 704 for supporting the cover 303 may be comprised of a support bar 741 erected upward from the linear motion plate part 721a, and a lifting block 742 that is supported movable vertically on the support bar.

Returning to FIG. 19 and FIG. 20, the cover 303 constituting the wafer transport apparatus 302 in the embodiment is supported on the same base 321 as the transport arm 322, and can be moved along the guide rail 324 together with the transport arm 322. Further, it is possible to move the cover 303 by the relative movement of the support bar 341 and the lifting block 342, and approach to or separate from the wafer surface F as a substrate surface formed by the wafer W surface. In other words, when viewing functionally the support bar 341 and the lifting block 342, it can be said that they constitute the cover approach and separation means MV that approaches or separates the cover 303 from the wafer surface F.

To the gas supply port 334 provided in the cover 303, the pipe 343 through which a gas G is supplied from the gas supply source described above is connected.

As described above, the wafer transport apparatus 302 of the embodiment comprises the cover 303 that is able to face and cover a wafer W to be transported, the gas supply means MG that supplies a gas G different from a surrounding atmosphere from the cover 303 and replaces the atmosphere on the wafer W surface with the gas G, and as in the first to third embodiments, an atmosphere replacement apparatus including the cover 303 and the gas supply means MG.

The wafer transport apparatus 302 configured as described above is operated under the control of the controller Cp (see FIG. 18), and the wafer W can be transported as follows. The controller Cp is appropriately configured to control the entire EFEM to be able to move the cover 303 by the cover approach and separation means MV in synchronization with the operation of the transport arm 322, and to supply the gas G from the gas supply means MG.

Here, as an example, an explanation will be made on the case of transporting a wafer W to the load lock chamber 81 from the FOUP connected to the load port 61 as one transfer position.

In other words, as shown in FIG. 22, the wafer transport apparatus 302 moves the base 321 along the guide rail 324, and positions the transport arm 322 in front of the load port 61 as one transfer position. Then, the wafer transport apparatus opens the door 61a of the load port 61 and the lid 62a of the FOUP 62 connected to the load port, and extends the transport arm 322 to insert the end effector 323 into the FOUP 62. At this time, as shown in FIG. 20, the end effector 323 enters with a slight gap just below the wafer W to be taken out, and lifts and holds the wafer W when the base 321 is raised a predetermined amount. At this time, the cover approach and separation means MV sets the open end 332a of the wall part 332 in the cover 303 (see FIG. 24) at a position higher than the upper surface of the wafer W (the wafer surface F) placed on the end effector 323.

And, as shown in FIG. 19, the transport arm 322 contracts to position the wafer W held by the end effector 323 above the base 321. Thus, the wafer W is opposed to the cover 303. In this state, the cover approach and separation means MV moves the cover 303 downward so as to contain slightly the top of the wafer W in the internal space S of the cover 303. Further, the gas supply means MG (see FIG. 24) starts supplying the gas G so as to replace the atmosphere on the wafer W surface from the air atmosphere that is the same as that inside the wafer transport chamber 5 to the atmosphere of the gas G.

In this case, as the cover 303 is slightly larger than the wafer W in a plan view as described above, even when the wafer W is housed in the internal space S, a gap is formed around the wafer W. Thus, by supplying the gas G from the gas supply port 334, the air, forming the atmosphere on the wafer W surface is efficiently discharged to the outside through the gap around the wafer W, and the atmosphere in the internal space S can be replaced with the nitrogen gas.

Reaching the position where the wafer W does not interfere, the load port 61 closes the door 61a and the lid 62a of the FOUP 62 so as to fill the FOUP 62 with a nitrogen gas, and prevents oxidation or adhesion of moisture on the surface of the housed wafer W other than the taken-out one.

As described above, in parallel with the replacement of the atmosphere on the surface of the wafer W, the base 321 moves along the guide rail 324, and reaches the front of the load lock chamber 81. By replacing the atmosphere on the surface of the wafer W in parallel with a part of the transportation, an increase in time is prevented.

Figure 23:
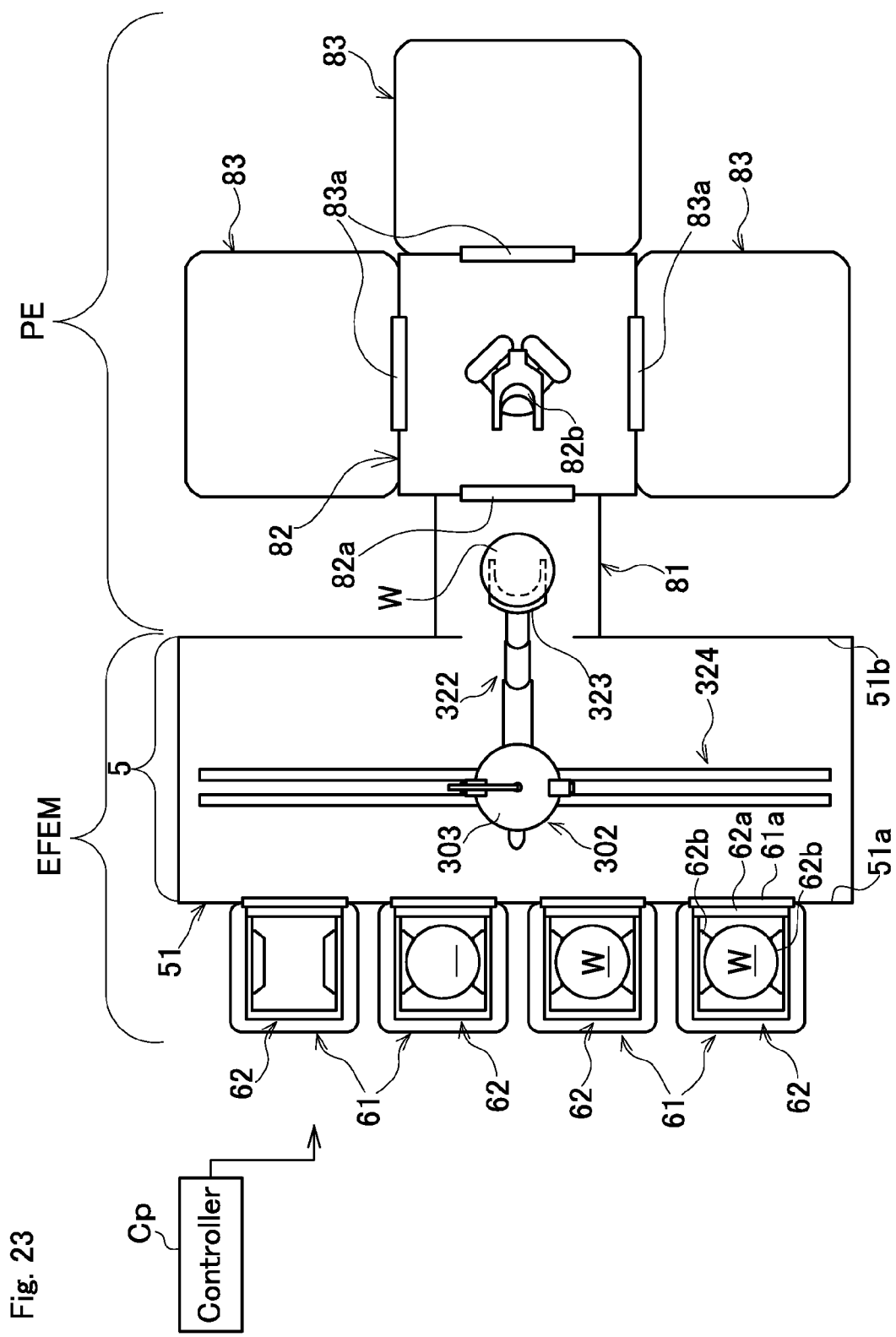
FIG. 23 is a plan view schematically showing the state that the transport arm of the wafer transport apparatus enters a load lock chamber.

Then, as shown in FIG. 23, the door 81a of the load lock chamber 81 (see FIG. 22) is opened, and the end effector 323 of the transport arm 322 enters inside the chamber. At this time, the cover approach and separation means MV raises the cover 303 not to interfere with the wafer W and the transport arm 322. Then, the base 321 is lowered to move down the transport arm 322 so as to transfer the wafer W on the end effector 323 into the load lock chamber 81.

As described above, by using the wafer transport apparatus 302, when transporting the wafer W from the FOUP to the load lock chamber 81, it is possible to maintain a proper surface state of the wafer W by replacing a local atmosphere around the wafer W surface via the cover 303, without replacing the entire atmosphere inside the wafer transport chamber 5.

Further, when transporting the wafer W from the load lock chamber 81 to the FOUP 62, it is possible to replace a local atmosphere around the wafer W surface as well by performing the above operation in reverse.

Here, a specific structure of the cover 303 will be explained. Any type of the covers 303A to 303G shown in FIGS. 24 to 26 can be employed, and used depending on the purpose.

The cover 303A shown in FIG. 24(a) has a simple structure, and is formed by suspending the wall part 332 from a peripheral edge 331a of the aforementioned disk-shaped main body part 331. At the center of the upper surface 331b, the gas supply port 334 configured similar to a common gas supply pipe opening is provided to enable to supply the gas G through the pipe 343 (see FIGS. 19 and 20). The gas supply port 334 communicates with the internal space S, and the supplied gas G can be released downward while filling the inner space. At this time, when a nitrogen gas is used as the gas G, because of its nature lighter than air, it is possible to increase the concentration of the nitrogen gas in the internal space S by excluding air easily from the internal space S. Thus, since the concentration of the nitrogen gas has been increased to a certain level or higher, the supply amount of the nitrogen gas may be reduced. Also in this way, it is possible to maintain the state that the atmosphere on the wafer W surface is replaced with the nitrogen gas.

The cover 303B shown in FIG. 24(b) is based on the structure of the cover 303A, and is provided with a diffusion plate 333 as a diffusion means below the main body part 331. The diffusion plate 333 has a large number of small holes 333a. Passing through the diffusion plate, the gas G is diffused substantially uniformly and discharged downward. Thus, when using the diffusion plate, the gas G can be appropriately supplied at any position on the wafer W surface.

Figure 25A:
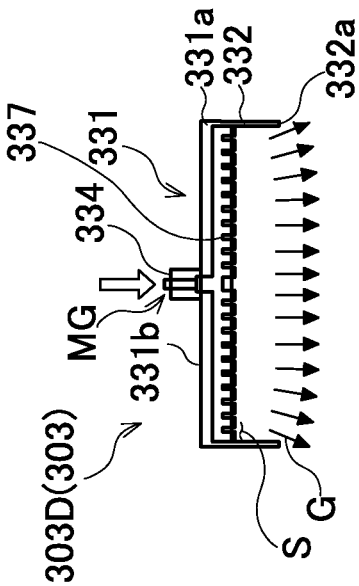
FIGS. 25(a) and (b) are explanatory drawings showing the structure of a cover different from that shown in FIG. 24.

The cover 303C shown in FIG. 25(a) is based on the structure of the cover 303A (see FIG. 24), and is provided with a heater 335 as a heating means inside the main body part 331. By configuring like this, it is possible to supply a gas G to the wafer W surface by heating the gas G, and increase the atmospheric temperature of the wafer W surface. Thus, it is possible to eliminate moisture by increasing the temperature on the wafer W surface. Further, when a process of increasing the temperature inside the processing apparatus PE (see FIG. 18) is required, it leads to a reduction of the processing time by preheating.

Figure 25B:
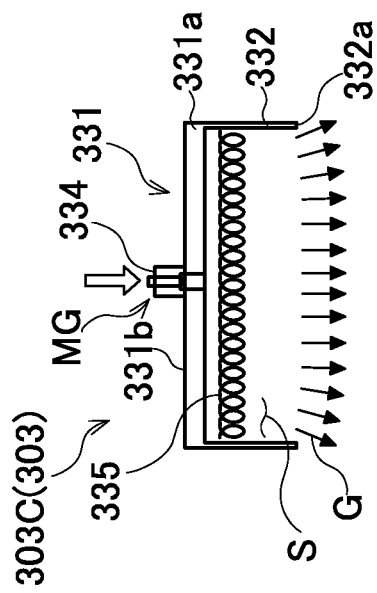

The cover 303D shown in FIG. 25(b) is based on the structure of the cover 303A (see FIG. 24), and is provided with a branch pipe 337 as a diffusion means of diffusing the gas G inside the main body part 331. By configuring like this, it is possible to uniformly diffuse and release the gas G, and supply the gas G properly at any position on the wafer W surface.

The cover 303E shown in FIG. 26(a) combines the structure of the cover 303B (see FIG. 24) and the structure of the cover 303C (see FIG. 25). By configuring like this, it is possible to heat, diffuse, and properly supply the gas G to the wafer W surface. As shown in this example, the diffusion plate 333 may be provided more than one (2 in the drawing), and it is possible to further diffuse the gas G and supply uniformly.

The cover 303F shown in FIG. 26(b) is based on the structure of the cover 303E, and the open end 332a of the wall part 332 is extended downward. By configuring like this, it is possible to cover not only the wafer W, but also the entire transport arm 322 by the internal space S. Thus, it is possible to further increase the concentration of the gas G filled in the space around the wafer W.

The cover 303G shown in FIG. 26(c) is based on the structure of the cover 303E, and the heating means is changed from the heater 335 to a heating lamp 336. Even in this structure, it is possible to heat, diffuse, and supply the gas G properly to the wafer W surface. By configuring so that the light radiated from the heating lamp 336 reaches the wafer W, the temperature on the wafer W surface may be increased directly without the gas G.

As described above, the wafer transport apparatus 302 as a substrate transport apparatus in the embodiment includes an atmosphere replacement apparatus similar to the atmosphere replacement apparatus 1 and 101 described in the first to third embodiments. In particular, the atmosphere replacement apparatus comprises the cover 303 capable of facing and covering a wafer W to be transported as a substrate, and the gas supply means MG that supplies a gas G having the properties different from a surrounding atmosphere from the cover 303, and replaces the atmosphere on the wafer W surface with the gas G. Further, the wafer transport apparatus 302 of the embodiment comprises the transport arm 322 that is supported on the base 321, and holds and transports the wafer W, and the support bar 341 that is provided on the same base 321 as the transport arm 322. The cover 303 is disposed at a position capable of facing the transport arm 322 via the support bar 341.

Being configured as above, when the transport arm 322 transports a wafer W, the gas supply means MG supply a gas G having properties different from a surrounding atmosphere to the surface of the wafer W from the cover 303 arranged above the transport arm 322, and the atmosphere around the wafer W surface can be replaced with the gas G. Thus, it is possible to avoid adverse effects on the wafer W surface by changing properly the atmosphere around the wafer W surface. In addition, as compared with the case of replacing all atmospheres around the wafer transport apparatus 302, it is possible to reduce the supply amount of gas G, and the cost and time required for replacing the atmosphere. Further, even when the gas G leaks to the surroundings, as the amount of gas is small, it is possible to suppress deterioration in the working environment. Further, as the cover 303 having the gas supply means MG is provided on the same base 321 as the transport arm 322, it is possible to reduce the size of the whole structure, and suppress the installation area.

Further, being configured to include the cover approach and separation means MV that approaches or separates the cover 303 from the wafer surface F as a substrate surface, it is possible to avoid interference between the cover 303 and the wafer W or the transport arm 322 by operating the cover 303 by the cover approach and separation means MV, and it is also possible to replace the atmosphere around the wafer W surface with a less mount of gas G by approaching the cover 303 to the wafer W depending on the transport state.

In addition, the cover 303 comprises the main body part 331 capable of facing the wafer W, and the wall part 332 provided on the peripheral edge 331a of the main body part 331, and the wafer W can be housed in the internal space S formed between the main body part 331 and the wall part 332, when the cover 303 is moved close to the wafer W by the cover approach and separation means MV. Thus, it is possible to reduce the supply amount of gas G by decreasing the amount of gas G leaking to the parts other than the wafer W surface by the wall part 332 provided in the cover 303.

Since the guide rail 24 is provided to support the base 321 movable, it is possible to expand the range of transporting the wafer W without increasing the length of the transport arm 322. Further, the transport arm 322 and the cover 303 can be simultaneously moved along with the base 321, and the atmosphere on the wafer W surface can be continuously replaced, when the wafer W is transported in the direction along the guide rail 324.

Further, the gas supply means MG is configured to include the gas inlet port 334 for introducing a gas G from the outside, and the diffusion plate 333 or the branch pipe 337 as a diffusing means of diffusing the gas G downward the cover 303 from the gas inlet port 34. It is possible to replace the atmosphere on the wafer W surface efficiently by diffusing the gas G efficiently, while the gas inlet port 334 is configured as simple as general piping.

The gas supply means MG is configured to further include the heater 335 or the heating lamp 336 as a heating means for heating the gas G. It is possible to increase the temperature on the wafer W surface and eliminate moisture by heating the supplied gas G When temperature increases is necessary in the processing apparatus PE, it is possible to reduce the processing time by preheating.

Further, being configured to use a wafer W as a substrate, include the wafer transport apparatus 302, and the housing 51 for housing this, and set the load port 61 and the load lock chamber 81 as a transfer position adjacent to the wall surfaces 51a and 51b of the housing 51, it is possible to configure as an effective EFEM that performs transfer between the transfer positions while maintaining the suitable atmosphere on the wafer W surface, by using the wafer transport apparatus 302 provided in the housing 51.

Fifth Embodiment

Figure 27A:
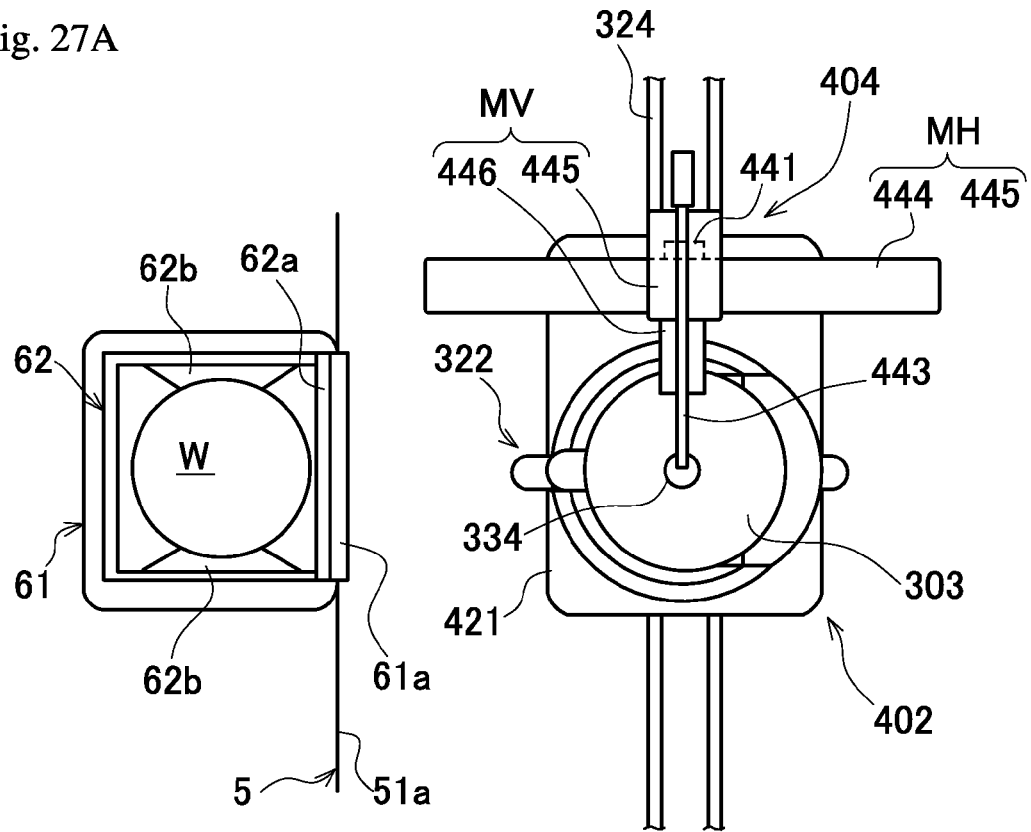
FIGS. 27(a) and (b) are explanatory drawings schematically showing enlarged essential parts of a wafer transport apparatus according to a fifth embodiment of the invention.
Figure 27B:
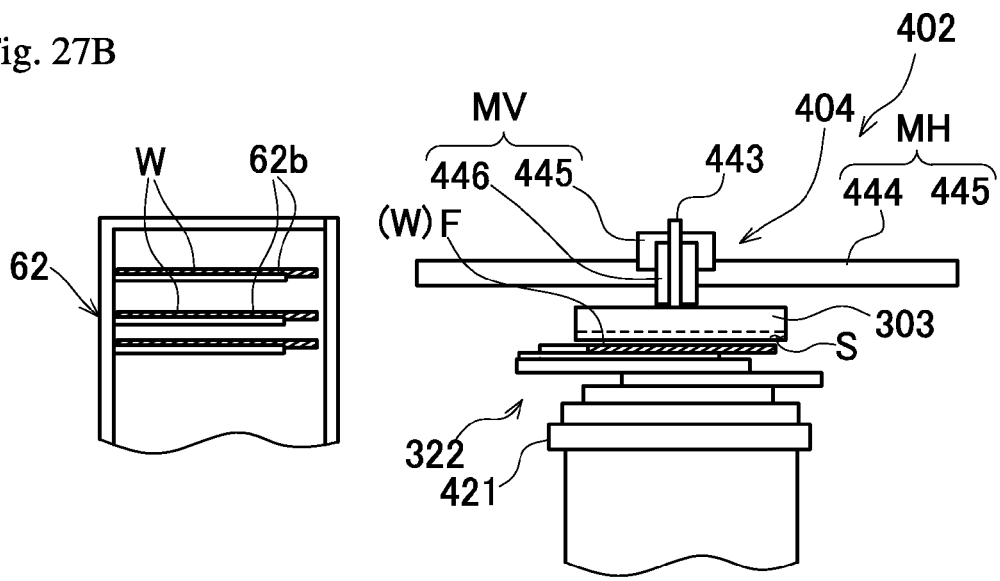

FIG. 27 is a schematic view showing a wafer transport apparatus 402 as a substrate transport apparatus of the fifth embodiment. In the drawing, the same parts as those in the fourth embodiment are denoted by the same reference numerals, and the explanation thereof is omitted.

In the wafer transport apparatus 402 of the embodiment, the shape of a base 421 for supporting the transport arm 322 is rectangular in a plan view, and the structure of a cover support means 404 that supports the cover 303, is different from that in the fourth embodiment.

In particular, a support bar 441 is erected on a side of the transport arm 322, a rail 444 for the cover extending in the horizontal direction orthogonal to the guide rail 324 is provided on the support bar 441, and a movable block 445 is supported movable on the rail 444 for the cover. Thus, the movable block 445 can move in the direction orthogonal to the wall surfaces 51a and 51b (see FIG. 18). Further, a lifting block 466 is supported on the movable block 445 to be movable in the vertical direction, and the cover 303 is supported by the lifting block 446.

In the above configuration, the movable block 445 and the rail 444 for the cover can move the cover 303 following a wafer that is moved by the transport arm 322. A cover moving means MH is configured as above. As the lifting block 446 moves relative to the movable block 445, the cover 303 can move in the vertical direction. A cover approach and separation means MV, configured in this manner, approaches and separates the cover 303 relative to the wafer surface F.

The gas supply port 334 provided in the cover 303 is connected to a pipe 443 from the gas supply source.

The wafer transport apparatus 402 can transport a wafer W as follows by under the control of the controller cp (see FIG. 18). At this time, the controller Cp moves the cover 303 by the cover moving means MH and the cover approach and separation means MV in synchronization with the movement of the transport arm 322, and the gas supply means MG supplies a gas G from the cover 303.

Figure 28A:
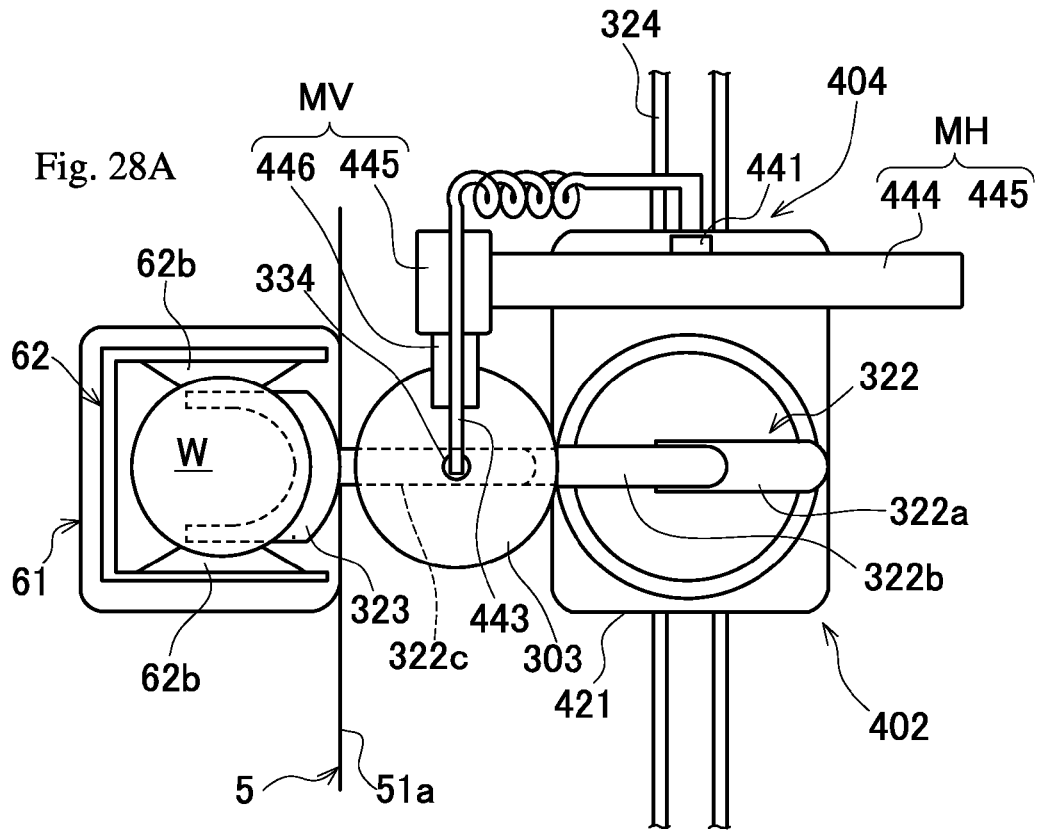
FIGS. 28(a) and (b) are explanatory drawings showing the state that the transport arm is operated from the state of FIG. 27.
Figure 28B:
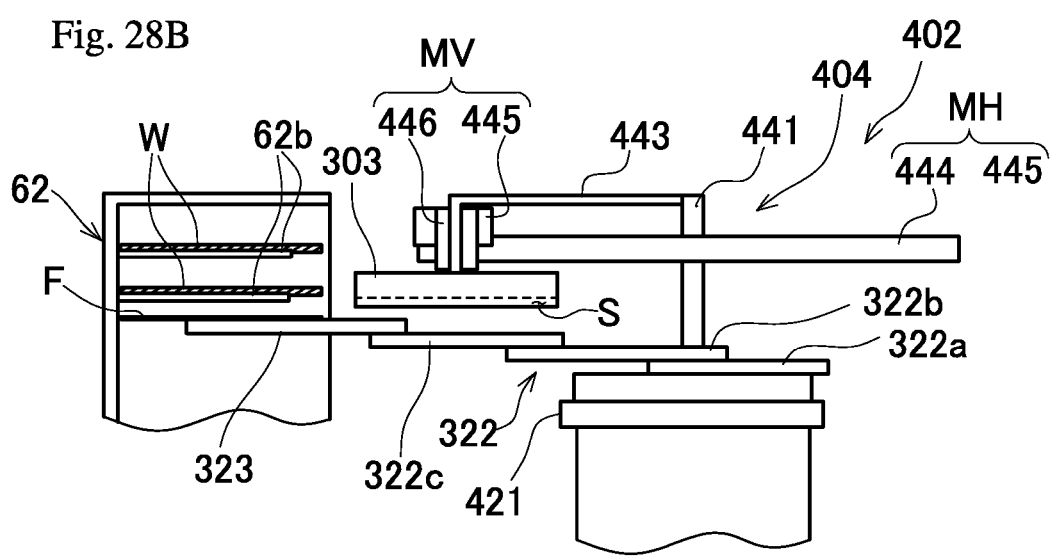

First, as shown in FIG. 28, the cover moving means MH can move the cover 303 to the front of the load port 61. Thus, before taking out the wafer W by extending the transport arm 322 to enter the FOUP 62, the cover 303 can stand in front of the FOUP 62, and go into the state to face and cover the wafer W. In this state, the cover approach and separation means MV moves the cover 303 close to the wafer W so as to supply the gas G. Thus, it is possible to reduce the time to expose the wafer W to the air atmosphere.

Then, the cover moving means MH moves the cover 303 in conjunction with the contraction of the transport arm 322, and through the state of FIG. 27, the gas G is continuously supplied in the state that the cover 303 faces the wafer W, until the cover is moved to the front of the load lock chamber 81 (see FIG. 2) that is the other transfer position. The cover 303 stops the movement linked to the transport arm 322 just before the load lock chamber 81, and is raised by the cover approach and separation means MV. And, the transport arm 322 transfers the wafer W into the load lock chamber 81.

As described above, as well as providing the same effect as that in the fourth embodiment, the wafer transport apparatus 402 can supply the gas G to the wafer W during transport by the transport arm 322 for a long time, and enhance the effect by the replacement of the atmosphere on the wafer W surface. In addition, the gas G can be effectively supplied while the size of the cover 303 is maintained substantially the same as the wafer W, and it is possible to avoid the waste of gas G.

As described above, since the wafer transport apparatus 402 in the embodiment comprises the cover 303 that can face and cover a wafer to be transferred, and the gas supply means MG that supplies a gas G different from a surrounding atmosphere from the cover 303, and replaces the atmosphere on the wafer W surface by the gas G, as in the aforementioned embodiment, it can be said that the wafer transport apparatus includes an atmosphere replacement apparatus comprising the cover 303 and the gas supply means MG, and it is possible to provide substantially the same effect as the aforementioned embodiment.

Further, since the wafer transport apparatus 402 is configured to include a cover moving means MH that supports the cover 303 movable in the direction rectangular to the guide rail 324, it is possible to cover the wafer for a long time by moving the cover 303 by the cover moving means MH in conjunction with the movement of the transport arm 322. Thus, it is possible to enhance the effect by the replacement of the atmosphere on the wafer W. It is also possible to further reduce the supply amount of gas G by reducing the size of the cover 303.

Sixth Embodiment

Figure 29:
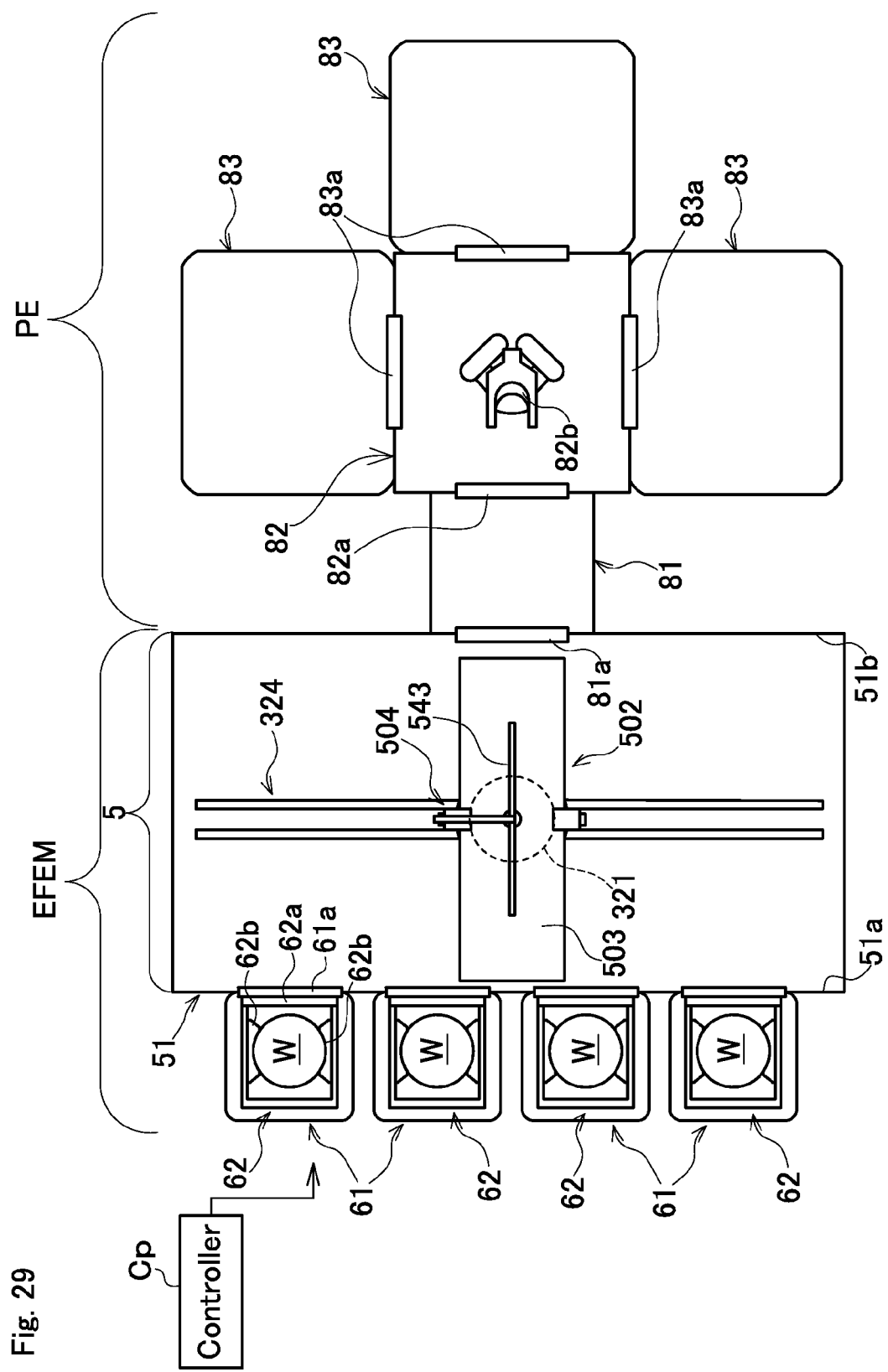
FIG. 29 is a plan view schematically showing an EFEM comprising a wafer transport apparatus according to a sixth embodiment of the invention.

FIG. 29 a schematic view showing a wafer transport apparatus 502 of the sixth embodiment. In the drawing, the same parts as those in the fourth and fifth embodiments are denoted by the same reference numerals, and the explanation thereof is omitted.

The wafer transport apparatus 502 in the embodiment is characterized in that the shape of a cover 503 supported by a cover support means 504 on the base 321 is substantially rectangular in a plan view. In particular, the cover 503 is arranged with the longitudinal side orthogonal to the guide rail 324, and across the guide rail 324, the short sides are close respectively to the wall surface 51a adjacent to the load port 61 that is one transfer position, and the wall surface 51b adjacent to the load lock chamber 81 that is the other transfer position. The length of the short side is slightly longer than the base 321.

Figure 30A:
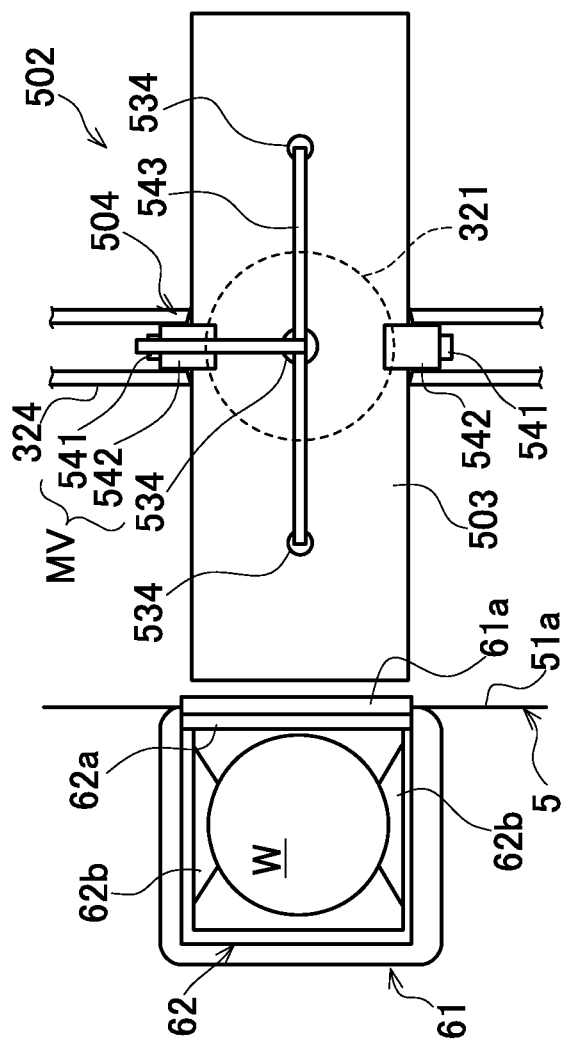
FIGS. 30(a) and (b) are explanatory drawings schematically showing enlarged essential parts of the wafer transport apparatus.
Figure 30B:
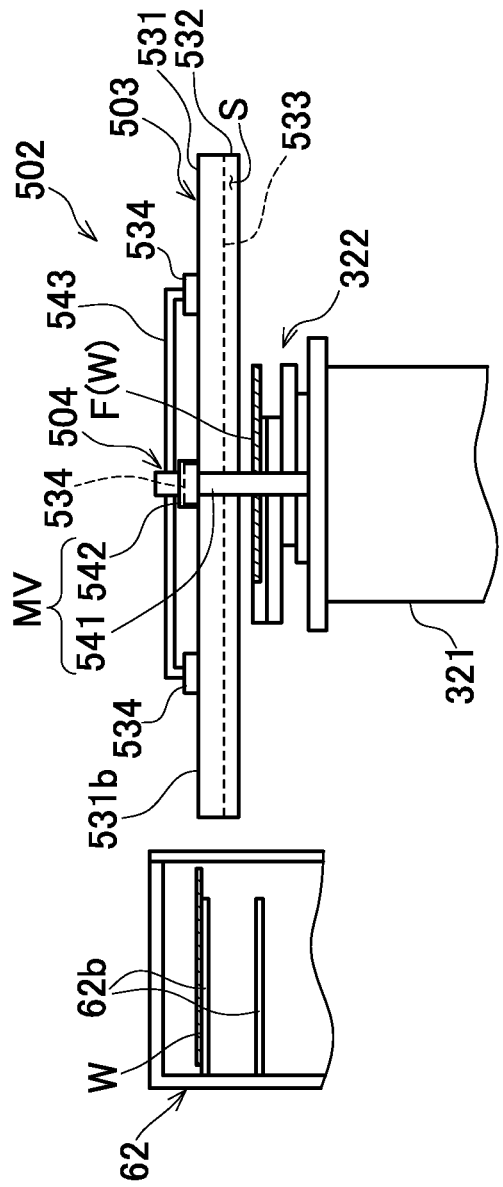
Figures 31A, 31B:
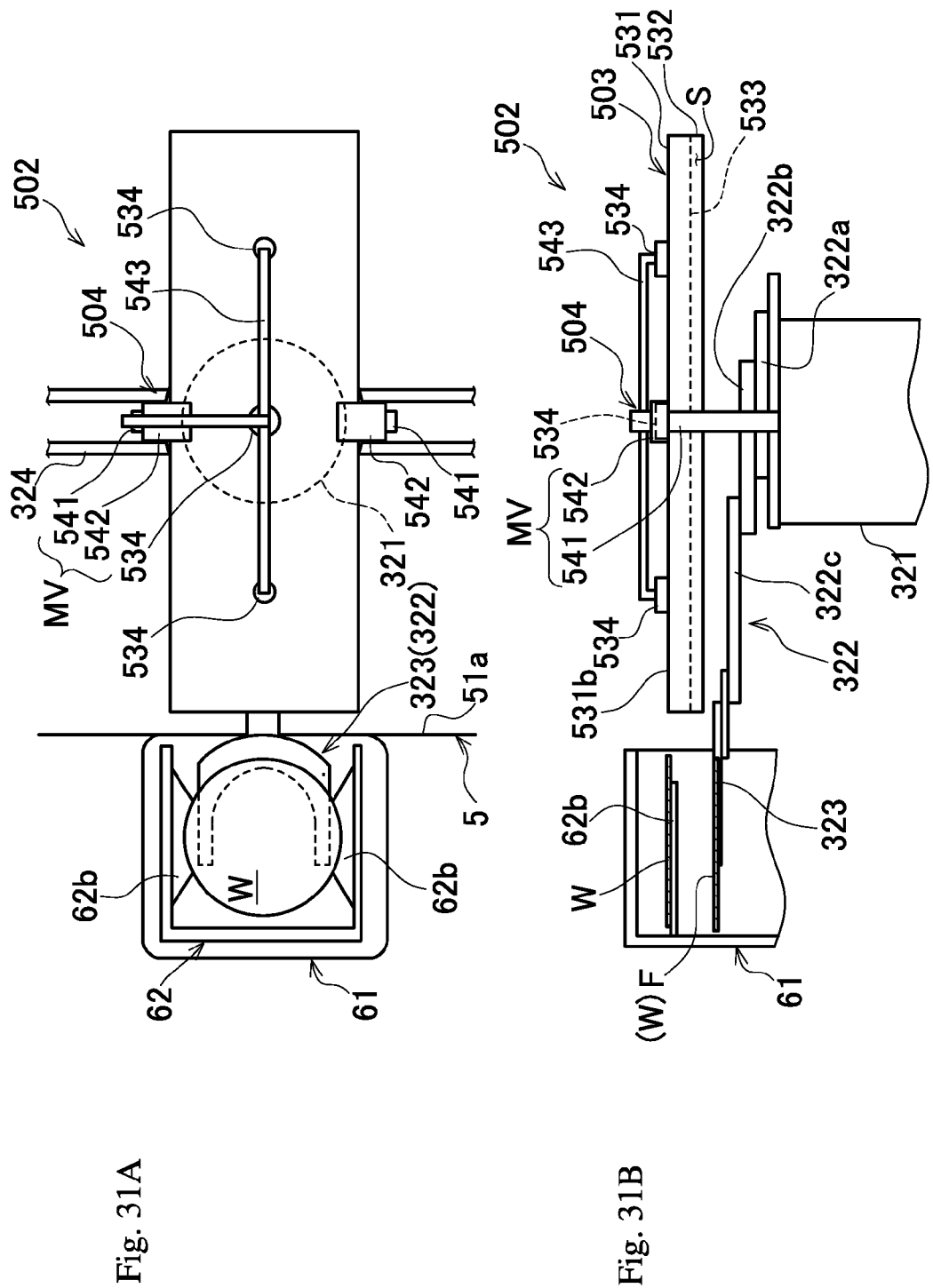
FIGS. 31(a) and (b) are explanatory drawings showing the state that the transport arm is operated from the state of FIG. 30.

FIG. 30 and FIG. 31 is an enlarged schematic view of a wafer transfer apparatus 502 in the embodiment. FIG. 30(a) is a plan view that each part is set to a reference position. FIG. 30(b) is a front view of that state. FIG. 31(a) is a plan view showing the state that a transport arm 322 described later extends to enter the FOUP 62. FIG. 31(b) is a front view of that state. In the drawings, the same parts as those in the fourth and fifth embodiments are denoted by the same reference numerals, and the explanation thereof is omitted.

Hereinafter, the structure of the wafer transport apparatus 502 will be explained with reference to FIG. 30 and FIG. 31.

The wafer transport apparatus 502 includes a cover 503 formed substantially rectangular in a plan view, and the transport arm 322 is arranged below the cover. The cover 503 is supported on the base 321 by a cover support means 504, and is able to move together with the movement of the base 321 along the guide rail 324.

Except the rectangular shape, the structure of the cover 503 is substantially the same as that of the cover 303B (see FIG. 24). The cover comprises a main body part 531 formed rectangular, and a wall part 532 provided suspending from a peripheral edge of the main body part. They form an internal space S opened downward. To prevent extremely uneven supply of gas G in the longitudinal direction, as well as a gas supply port 534 provided at the center of the upper surface 531b of the main body part 531, gas supply ports 534 are provided at a position apart on both sides in the longitudinal direction, and a gas supply pipe 543 is branched and connected to these three gas supply ports 534. In this configuration, it is possible to supply the gas G from three locations in the longitudinal direction, and to make uniform the distribution of the gas G supplied downward the cover 503. Of course, the gas supply port 534 may be provided at four or more positions, not only in three places. Similar to FIG. 24, a gas supply means MG is also configured.

The cover support means 504 is configured to have the same structure as the cover support means 4 of the fourth embodiment (see FIG. 19). The cover support means 504 comprises a pair of support bars 541 that is apart in the extending direction of the guide rail 324 and erected on the base 321, and lifting blocks 542 that are supported movable in the vertical direction by the support bars. The lifting blocks 542 support the upper surface 531b of the main body part 531 of the cover 503. When viewing functionally the support bar 541 and the lifting block 542, it can be said that they constitute the cover approach and separation means MV, which makes the cover 503 approaches to and separate from the wafer surface.

When taking out the wafer W from the FOUP 62, as shown in FIG. 30, first the base 321 is positioned in front of the FOUP 62. At this time, one of the short sides of the cover 503 is positioned just before the door 61a of the load port 61.

In this state, the door 61a of the load port 61 and the lid 62a of the FOUP 62 are opened, the transport arm 322 is extended to insert the end effector 323 into the FOUP 62, as shown in FIG. 31. In this state, the base 321 is raised, and the wafer W can be held on the end effector 323.

Figure 32:
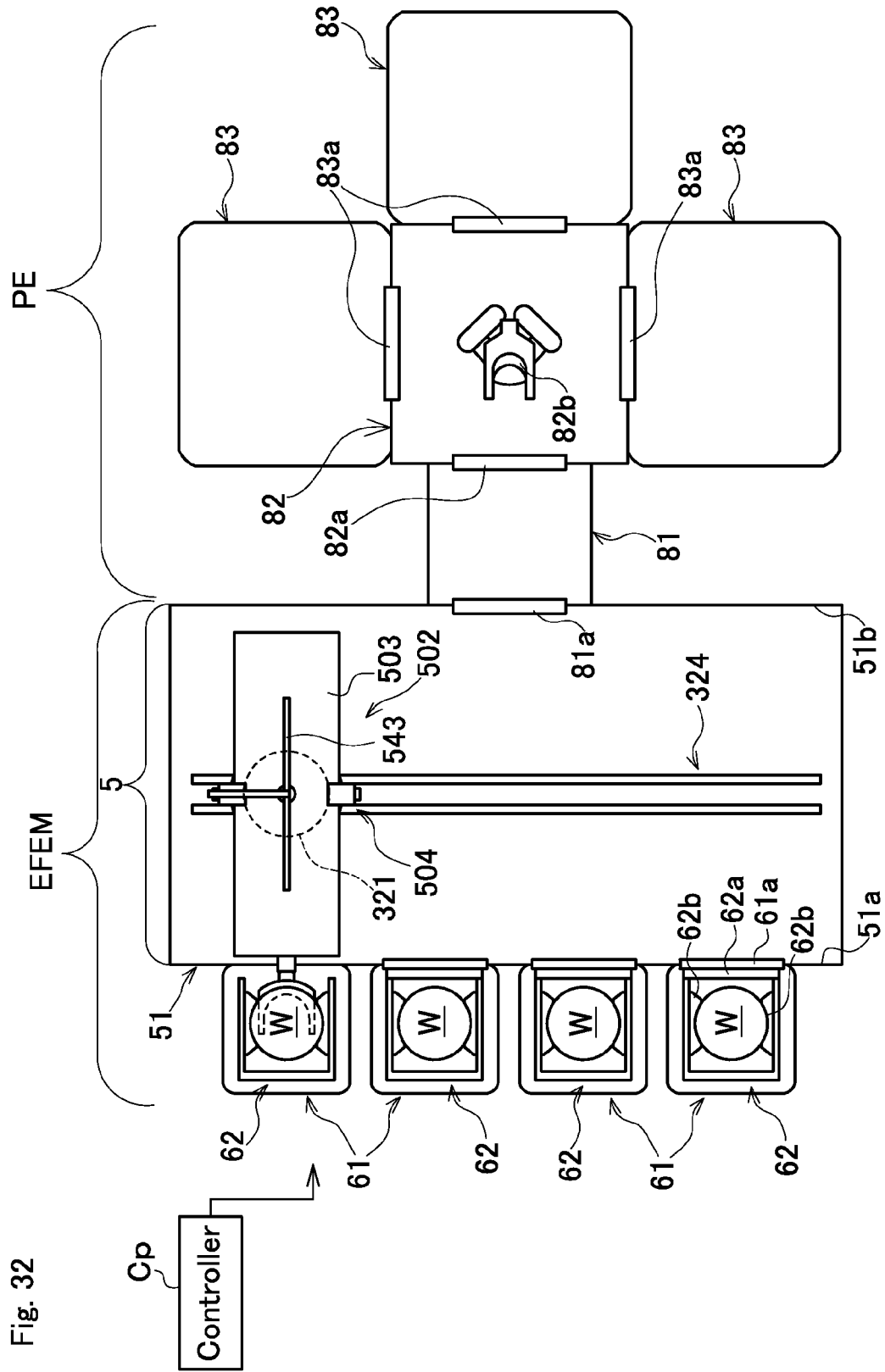
FIG. 32 is a plan view schematically showing the state that the transport arm of the wafer transport apparatus enters a FOUP.

FIG. 32 is a plan view showing the whole of EFEM in this state. In this state, the transport arm 322 contracts to take out the wafer W to the outside of the FOUP 62. Since the cover 503 has extended to just before the FOUP 62, immediately after the wafer W is taken out to the outside of the FOUP 62, the wafer W comes opposite to the cover 503. In this state, the cover 503 is moved downward by the cover approach and separation means MV (see FIGS. 30 and 31) to contain a part of the upper surface of the wafer W in the internal space S. Further, the gas supply means MG (see FIG. 24) starts to supply the gas G.

The transport arm 322 contracts further, and the wafer W is positioned above the base 321. In this process, the gas G is continuously supplied to the surface of the wafer W, and the atmosphere on the wafer W surface is continuously replaced with the gas G. At this time, if any one of the gas supply ports 534 is appropriately selected in accordance with the movement of the wafer W by the transport arm 322, and the destination of gas G is changed, it is possible to further reduce the supply amount of gas G.

Figure 33:
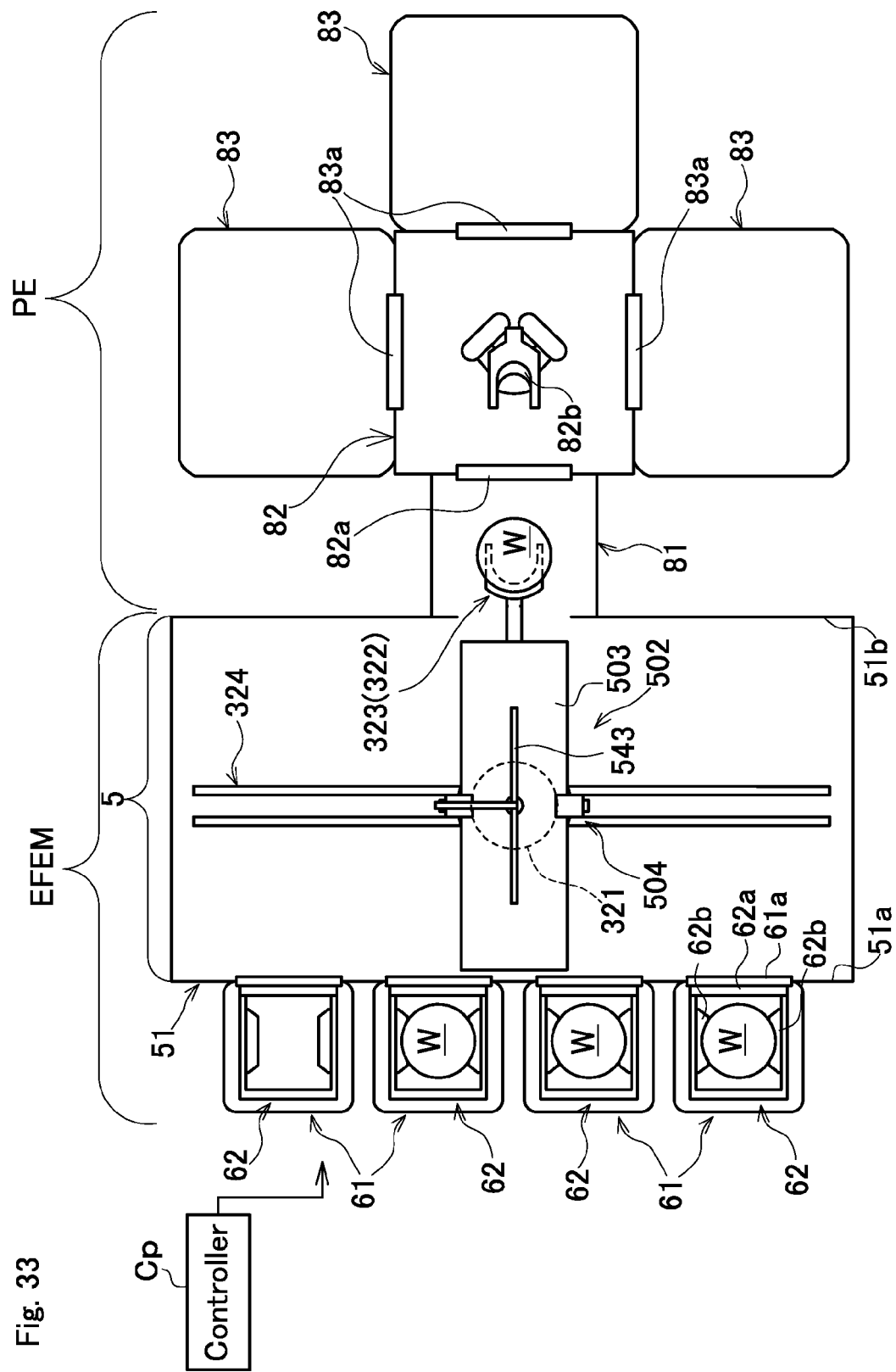
FIG. 33 is a plan view schematically showing the state that the transport arm of the wafer transport apparatus enters the load lock chamber.

The base 321 moves to the front of the load lock chamber 81 along the guide rail 324. The transport arm 322 moves to the front of the load lock chamber 81, while supplying the gas G. Then, the cover 503 move up slightly not to interfere with the transport arm or wafer W, the door 81a of the load lock chamber 81 are opened, and the transport arm 322 extends further to insert the end effector 323 into the load lock chamber 81, as shown in FIG. 33. At this time, since one of the short sides of the cover 503 has extended close to the load lock chamber 81, the replacement of the atmosphere on the wafer W surface with the gas G, can be continued until just before the wafer W enters the load lock chamber 81, and it is possible to reduce the time to expose the wafer W surface to the air by replacing the atmosphere for a longer time. In this state, the base 321 is moved down, the position of the transport arm 322 is lowered, and the wafer W can be placed in the load lock chamber 81.

Even when using the wafer transfer device 502, as in the above described embodiment, it is possible to maintain proper surface state of the wafer W by replacing a local atmosphere around the wafer W surface via the cover 503, without replacing the entire atmosphere inside the wafer transport chamber 5. Further, when transporting the wafer W from the load lock chamber 81 to the FOUP 62, it is possible to replace the local atmosphere around the wafer W surface as well by performing the above operation in reverse.

As described above, since the wafer transport apparatus 502 in the embodiment comprises the cover 503 that can face and cover a wafer to be transferred, and the gas supply means MG that supplies a gas G different from the surrounding atmosphere from the cover 503, and replaces the atmosphere on the wafer W surface by the gas G, as the above described embodiment, it can be said that the wafer transport apparatus includes an atmosphere replacement apparatus comprising the cover 503 and the gas supply means MG, and can provide substantially the same effect as the above described embodiment.

Further, the load port 61 and the load lock chamber 81 as a transfer position for transferring the wafer W to the transport arm 322 are set on both sides across the guide rail 324, and the cover 503 is configured to extend in the direction orthogonal to the guide rail 324. Thus, when transporting the wafer W to two axes in the extending direction of the guide rail 324 and the direction orthogonal to that direction, the cover 503 can cover the surface of the wafer W during transportation for a long time, and the gas G can be effectively supplied to the surface of a substrate during transportation, while the structure is simple.

Seventh Embodiment

Figure 34:
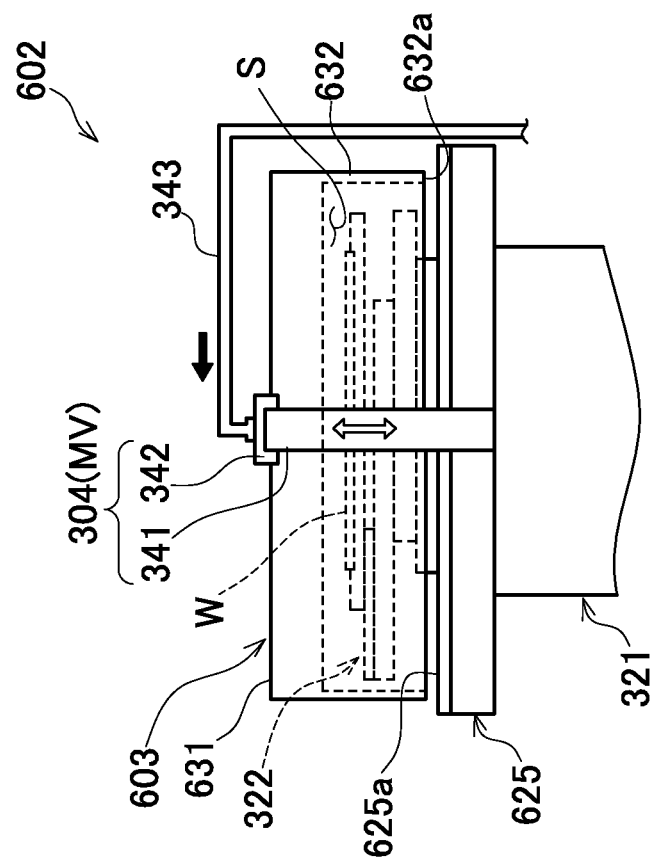
FIG. 34 is an explanatory drawing for explaining the structure of a wafer transport apparatus according to a seventh embodiment of the invention.

FIG. 34 a schematic view showing a wafer transport apparatus 602 of the seventh embodiment. In the drawing, the same parts as those in the fourth to sixth embodiments are denoted by the same reference numerals, and the explanation thereof is omitted.

The wafer transport apparatus 602 is based on the structure of the wafer transport apparatus 302 in the fourth embodiment (see FIG. 19). The shape of a cover 603 is changed, and a cover receiving member 625 is provided on the base 321.

In particular, the cover 603 comprises a disk-shaped main body part 631, and a wall part 632 formed suspending from a peripheral edge of the main body part. They form an internal space S opened downward. The main body part 631 is formed larger than the cover 303 of the fourth embodiment (see FIG. 19), so that the entire transport arm 322 contracted on the base 321 can be housed in the internal space S.

On the top of the base 321, a disk-shaped cover receiving member 625 is provided. The cover receiving member 625 has a diameter slightly larger than the cover 603 in a plan view. Thus, when the cover 603 moves downward, the open end 632a of the wall part 632 of the cover 603 comes close to the upper surface 625a of the cover receiving member 625, and the cover receiving member can substantially close the internal space S in cooperation with the cover. Therefore, it is possible to further increase the concentration of gas G, when the gas G is supplied to the internal space S, and increase the effect by the replacement of atmosphere.

Of course, it is permitted to make contact between the open end 632a and the upper surface 625a. By contacting and sealing the both after the atmosphere is replaced with the gas G, the atmosphere replaced state can be maintained even after the supply of gas G is stopped, and the wafer W surface is not contaminated.

Even when configuring as above, being provided with the cover 603 capable of facing and contacting a wafer W to be transported, and the gas supply means MG that supplies a gas G different from a surrounding atmosphere from the cover 603 and replaces the atmosphere on the wafer W surface with the gas G, as in the aforementioned embodiments, it can be said that there is provided with an atmosphere replacement apparatus that is configured to include the cover 603 and the gas supply means MG. Thus, it is possible to obtain the same effect as the aforementioned embodiments.

In addition, being configured to have the cover receiving member 625 on the base 321, which can substantially close the internal space S in cooperation with the cover, when the cover 603 approaches the wafer W, and the open end 632a of the wall part 632 of the cover 603 approaches or contacts the cover receiving member, a substantially closed space is formed between the cover 603 and the cover receiving member 625, and the supply amount of gas G can be further reduce by housing the wafer W in the space.

The specific structure of each part is not intended to be limited to only the aforementioned embodiment.

For example, in the aforementioned embodiment, a nitrogen gas is used as a gas G for replacing the atmosphere around a wafer W. But, various gases G such as air and ozone can be used depending on a process. A clean air atmosphere is assumed within the wafer transport chamber 5, but it may be any atmosphere having properties different from the air constituting that atmosphere. Further, it is possible to use clean air with a higher cleanliness, or air increased in a temperature by a heating means.

Further, in the aforementioned embodiments, a gas G is supplied in the state that the whole or a part of a wafer W is housed in the internal space S provided in the cover 3 (103, 303, 503, 603). However, the same effect can be obtained by supplying the gas G in the state that the cover 3 (103, 303, 503, 603) approaches the surface of a wafer W without housing the wafer W in the cover 3 (103, 303, 503, 603). Further, the same effect can be obtained by configuring the cover 3 (103, 303, 503, 603) only by the main body part 31 (131, 331, 531, 631) without having the suspending wall part 32 (132, 332, 532, 632).

Further, the timing of starting or stopping the supply of gas G by the cover supply means MG can be changed appropriately according to a processing process. In particular, the supply of gas G may be started several seconds after a wafer is taken out of the FOUP 62, or the supply amount may be changed according to the concentration of the gas G in the cover 3 (103, 303, 503, 603). The same effect can be obtained by limiting the supply of gas G to a process from taking out a processed wafer W from the load lock chamber 81 to returning to the FOUP 62.

In the aforementioned embodiments, a wafer W is transferred between the load lock chamber 81 and the FOUP 62 on the load port 61. Embodiments of the present invention are not intended to be limited to this aspect, and appropriately applied to the case where a wafer is transported between FOUPs 62. Further, the wafer W transfer position is not limited to be apart in a horizontal direction, but may be apart in a vertical direction. In such a case, the cover 3 (103, 303, 503, 603) may be moved so as to face a wafer W, following to movement of the wafer W in a vertical direction, and a gas G may be supplied to replace the atmosphere around the wafer W.

Further, in the aforementioned embodiments, a wafer W is assumed as a substrate, and the wafer transport apparatus 2 (202, 302, 402, 502, 602) or the wafer transport system TS is configured. Embodiments of the invention are applicable to a transport system that transports various precision processed products such as a glass substrate. In other words, the embodiments can be configured as a substrate transport apparatus or a substrate transport system that handles common substrates such as a glass substrate.

In addition, the transport arm 22 or 322 is not limited to the link type arm robot or SCARA type horizontal articulated robot described hereinbefore. Various types of robot can be used.

The other configurations may be modified without departing from the spirits or essential characteristics of the present invention.

What is claimed is:

1. An atmosphere replacement apparatus, comprising:
   a cover that is able to face and cover a substrate to be transported; and
   a gas supply unit that supplies gas having properties different from a surrounding atmosphere from the cover, and replaces an atmosphere on a surface of a substrate by the gas;
   wherein, the atmosphere replacement apparatus is used in a substrate transport system for transporting a substrate, between multiple transfer positions by a substrate transport apparatus, further comprising:
   a cover moving unit that supports the cover movable independently of the substrate transport apparatus,
   wherein, when the substrate transport apparatus transports a substrate, the cover moving unit moves the cover to a position opposite to a substrate.

2. The atmosphere replacement apparatus according to claim 1, further comprising a cover approach and separation unit that approaches or separates the cover from the surface of a substrate.

3. The atmosphere replacement apparatus according to claim 2, wherein
   the cover comprises a main body part able to face a substrate and a wall part provided on a periphery of the main body part, and
   a substrate is housed in an internal space formed between the main body part and the wall part, when the cover approach and separation unit moves the cover close to a substrate.

4. The atmosphere replacement apparatus according to claim 3, further comprising a cover receiving member in the substrate transfer apparatus side, which is able to substantially close the internal space in cooperation with the cover, when the cover moves close to a substrate, and an open end of the wall part of the cover approaches or contacts the cover receiving member.

5. The atmosphere replacement apparatus according to claim 1, wherein
   the gas supply unit comprises a gas inlet for introducing gas from outside, and a gas diffusion unit that diffuses gas downward the cover from the gas inlet.

6. The atmosphere replacement apparatus according to claim 1, wherein the gas supply unit comprises a heating unit for heating the gas.

7. A substrate transport system, comprising the atmosphere replacement apparatus according to claim 1, and a substrate transport apparatus,
wherein the cover moving unit is configured by using a guide rail that constitutes a part of the substrate transport apparatus.

8. An EFEM, comprising the substrate transport system according to claim 7, and a housing that covers the substrate transport system,
wherein the substrate is a wafer, and the transfer position is set adjacent to a wall surface of the housing.

9. An EFEM, comprising a substrate transport system that comprises the atmosphere replacement apparatus according to claim 1 and a substrate transport apparatus, and a housing that covers the substrate transport system,
wherein the substrate is a wafer, and the cover moving unit is supported on a ceiling surface provided in the housing, and the transfer position is set adjacent to a wall surface of the housing.

10. A substrate transport apparatus comprising an atmosphere replacement apparatus comprising:
a cover that is able to face and cover a substrate to be transported; and
a gas supply unit that supplies gas having properties different from a surrounding atmosphere from the cover, and replaces an atmosphere on a surface of a substrate by the gas;
the substrate transport apparatus further comprising:
a transport arm that is supported by a base, and holds and transports a substrate; and
a support bar that is provided on the same base as the transport arm,
wherein the cover is located at a position able to face the transport arm via the support bar.

11. The substrate transport apparatus according to claim 10, further comprising a cover approach and separation unit that approaches or separates the cover from the surface of a substrate.

12. The substrate transport apparatus according to claim 11, wherein the cover comprises a main body part able to face to a substrate and a wall part provided on an edge part of the main body part, and
an internal space formed between the main body part and the wall part is able to house a substrate, when the cover is moved close to the substrate by the cover approach and separation unit.

13. The substrate transport apparatus according to claim 12, further comprising a cover receiving member that is provided on the base, and substantially closes the internal space in cooperation with the cover, when the cover moves close to a substrate, and an open end of the wall part of the cover approaches or contacts the cover receiving member.

14. The substrate transport apparatus according to claim 11, further comprising a guide rail that supports the base movable.

15. The substrate transport apparatus according to claim 14, further comprising a cover moving unit that supports the cover movable in a direction orthogonal to the guide rail.

16. The substrate transport apparatus according to claim 15, wherein
a transfer position for transferring a substrate to/from the transfer arm is set on both sides of the guide rail, across the guide rail, and
the cover extends in a direction orthogonal to the guide rail.

17. The substrate transport apparatus according to claim 11, wherein
the gas supply unit comprises a gas inlet for introducing gas from outside, and a gas diffusion unit that diffuses gas downward the cover from the gas inlet.

18. The substrate transport apparatus according to claim 11, wherein the gas supply unit comprises a heating unit for heating the gas.

19. An EFEM, comprising the substrate transport apparatus according to claim 11, and a housing that covers the apparatus,
wherein the substrate is a wafer, and a transfer position for transferring a substrate is set adjacent to a wall surface of the housing.

* * * * *